(12) United States Patent
Wang et al.

(10) Patent No.: US 11,493,577 B2
(45) Date of Patent: Nov. 8, 2022

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Zhen Wang, Shanghai (CN); Shao Che, Shanghai (CN); Hai Lu, Shanghai (CN); Xianwen Fan, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 17/199,400

(22) Filed: Mar. 11, 2021

(65) Prior Publication Data
US 2021/0396824 A1 Dec. 23, 2021

(30) Foreign Application Priority Data
Jun. 19, 2020 (CN) .......................... 202010565504.3

(51) Int. Cl.
*G01R 33/36* (2006.01)
*H03F 3/19* (2006.01)

(52) U.S. Cl.
CPC ..... *G01R 33/3621* (2013.01); *G01R 33/3628* (2013.01); *H03F 3/19* (2013.01); *H03F 2200/451* (2013.01)

(58) Field of Classification Search
CPC ........... G01R 33/3621; G01R 33/3628; G01R 33/3607; G01R 33/365; G01R 33/3657; G01R 33/34084; G01R 33/3415; H03F 3/19; H03F 2200/451; H03F 3/195; H03F 3/45475; H03F 2203/45568
See application file for complete search history.

(56) References Cited

U.S. PATENT DOCUMENTS

| | | | |
|---|---|---|---|
| 4,839,594 A * | 6/1989 | Misic | G01R 33/34046 324/318 |
| 6,847,210 B1 | 1/2005 | Eydelman et al. | |
| 7,701,209 B1 * | 4/2010 | Green | G01R 33/307 324/318 |
| 8,138,762 B2 | 3/2012 | Zhu | |
| 9,678,180 B2 | 6/2017 | Yang et al. | |
| 2012/0223714 A1* | 9/2012 | Greim | G01R 33/365 324/318 |
| 2013/0082707 A1* | 4/2013 | Biber | G01R 33/583 324/309 |
| 2014/0197832 A1 | 7/2014 | Driesel et al. | |
| 2018/0329005 A1 | 11/2018 | Sodickson et al. | |
| 2018/0335491 A1* | 11/2018 | Yang | G01R 33/3657 |

(Continued)

*Primary Examiner* — G. M. A Hyder
(74) *Attorney, Agent, or Firm* — Metis IP LLC

(57) ABSTRACT

The present disclosure provides a magnetic resonance imaging (MRI) radio frequency (RF) coil assembly. The MRI RF coil assembly may include one or more coils and one or more control circuits. Each of the one or more coils may include a first end and a second end. Each of the one or more control circuits may electrically connect the first end and the second end of one of the one or more coil. Each of the one or more control circuits may be configured to adjust an operation of the coil that is electrically connected with the control circuit based on an input control signal. The one or more control circuits may be located at different regions.

14 Claims, 16 Drawing Sheets

(56) References Cited

U.S. PATENT DOCUMENTS

| | | |
|---|---|---|
| 2019/0235034 A1 | 8/2019 | Greim et al. |
| 2019/0277926 A1* | 9/2019 | Stormont .............. G01R 33/54 |
| 2019/0310329 A1 | 10/2019 | Malik et al. |
| 2019/0310331 A1 | 10/2019 | Otake et al. |
| 2019/0369176 A1 | 12/2019 | Dalveren et al. |
| 2020/0072921 A1 | 3/2020 | Che et al. |

* cited by examiner

1200

1210

1220

SYSTEMS AND METHODS FOR MAGNETIC RESONANCE IMAGING

CROSS-REFERENCE TO RELATED APPLICATIONS

This application claims priority to Chinese Patent Application No. 202010565504.3, filed on Jun. 19, 2020, the contents of which are hereby incorporated by reference.

TECHNICAL FIELD

The present disclosure generally relates to magnetic resonance imaging (MRI), and more particularly, relates to MRI systems including one or more coil assemblies and methods for controlling the coil assemblies.

BACKGROUND

MRI techniques have been widely used in medical diagnosis. In an MRI system, a coil assembly (e.g., a radio frequency receiving coil assembly) may be configured to emit pulse signals to a subject and/or receive MR signals from the subject in the acquisition of image data. Conventionally, some electronic components (e.g., a capacitor, an inductor, and a diode) of a coil assembly may be mounted in a coil body of the coil assembly, and a mechanical housing for protecting the coil assembly may be thick and large. Thus, the coil assembly may have relatively large volume and weight, require a high preparation cost, and have a high preparation difficulty. During a scan on the subject, the coil assembly may be located on the subject, which increases the difficulty in using the coil assembly and makes the subject uncomfortable, thereby having a poor efficiency for imaging. Therefore, it is desirable to provide MRI systems including one or more coil assemblies and methods for controlling the coil assemblies, which ensures the image quality, reduces a volume, a weight, and a cost of the coil assembly, simplifies a scan operation on the subject, and improves the patient experience.

SUMMARY

According to one aspect of the present disclosure, a magnetic resonance imaging (MRI) radio frequency (RF) coil assembly is provided. The MRI RF coil assembly may include one or more coils and one or more control circuits. Each of the one or more coils may include a first end and a second end. Each of the one or more control circuits may electrically connect the first end and the second end of one of the one or more coil. Each of the one or more control circuits may be configured to adjust an operation of the coil that is electrically connected with the control circuit based on an input control signal. The one or more control circuits may be located at different regions.

In some embodiments, the operation of the coil may include a detuned state or a tuned state, and the control circuit may be configured to adjust a switch between the detuned state and the tuned state based on the input control signal.

In some embodiments, one of the one or more control circuits may include a frequency modulation circuit, a detuning circuit, and a preamplifier. A first end of the frequency modulation circuit may electrically connect the first end of the coil. A first end of the detuning circuit may electrically connect a second end of the frequency modulation circuit, and a second end of the detuning circuit may electrically connect the second end of the coil. A first input end of the preamplifier may electrically connect a third end of the detuning circuit, a second input end of the preamplifier may electrically connect a fourth end of the detuning circuit. The input control signal may be inputted to the detuning circuit via the third end. The fourth end of the detuning circuit may have a grounded connection. An output end of the preamplifier may be configured to output a radio frequency signal when the coil is in the tuned state.

In some embodiments, the detuning circuit may include a capacitor, a first inductor, a second inductor, a second inductor, and a diode. A first end of the capacitor may electrically connect a second end of the frequency modulation circuit, and a second end of the capacitor may electrically connect the second end of the coil. A first end of the first inductor may electrically connect the first end of the capacitor, and a second end of the first inductor may electrically connect the first input end of the preamplifier. A first end of the second inductor may electrically connect the second end of the capacitor, and a second end of the second inductor may electrically connect the second input end of the preamplifier. A positive pole of the diode may electrically connect the first input end of the preamplifier, and a negative pole of the diode may electrically connect the second input end of the preamplifier. The positive pole of the diode may be an input end of the input control signal.

In some embodiments, the control circuit may include a first frequency modulation circuit, a detuning circuit, a second frequency modulation circuit, and a preamplifier. A first end of the first frequency modulation circuit may electrically connect the first end of the coil. A first end of the detuning circuit may electrically connect a second end of the first frequency modulation circuit. A first end of the second frequency modulation circuit may electrically connect a second end of the detuning circuit, and a second end of the second frequency modulation circuit may electrically connect the second end of the coil. A first input end of the preamplifier may electrically connect a third end of the detuning circuit, and a second input end of the preamplifier may electrically connect a fourth end of the detuning circuit. The input control signal may be inputted to the detuning circuit via the third end. The fourth end of the detuning circuit may have a grounded connection. An output end of the preamplifier may be configured to output a radio frequency signal when the coil is in the tuned state.

In some embodiments, the detuning circuit may include a capacitor, a first inductor, a second inductor, and a diode. A first end of the capacitor may electrically connect a second end of the first frequency modulation circuit, and a second end of the capacitor may electrically connect the first end of the second frequency modulation circuit. A first end of the first inductor may electrically connect the first end of the capacitor, and a second end of the first inductor may electrically connect the first input end of the preamplifier. A first end of the second inductor may electrically connect the second end of the capacitor, and a second end of the second inductor may electrically connect the second input end of the preamplifier. A positive pole of the diode may electrically connect the first input end of the preamplifier, and a negative pole of the diode may electrically connect the second input end of the preamplifier. The positive pole of the diode may be an input end of the input control signal.

In some embodiments, one of the one or more control circuits may include a matching circuit, a detuning circuit, a frequency modulation circuit, and a preamplifier. A first end of the matching circuit may electrically connect the first end of the coil. The matching circuit may be configured to adjust an impedance in a loop including the matching circuit. A first end of the detuning circuit may electrically connect a second end of the matching circuit. A first end of the frequency modulation circuit may electrically connect a second end of the detuning circuit, and a second end of the frequency modulation circuit may electrically connect the second end of the coil. A first input end of the preamplifier may electrically connect the first end of the matching circuit, and a second input end of the preamplifier may electrically connect a second end of the matching circuit and have a grounded connection. A third end of the detuning circuit may electrically connect the second input end of the preamplifier. A fourth end of the detuning circuit may be configured to input the input control signal. An output end of the preamplifier may be configured to output a radio frequency signal when the coil is in the tuned state.

In some embodiments, one of the one or more control circuits may include a first capacitor, a second capacitor, an inductor, and a diode. A first end of the first capacitor may electrically connect the second input end of the preamplifier. A first end of the second capacitor may electrically connect a second end of the first capacitor, and a second end of the second capacitor may electrically connect the first end of the frequency modulation circuit. A second end of the inductor may electrically connect the second end of the second capacitor. A positive pole of the diode may electrically connect the second end of the inductor, and a negative pole of the diode may electrically connect the second input end of the preamplifier. The first end of the inductor may be an input end of the input control signal.

In some embodiments, an input impedance of the preamplifier may be less than 0.5 Ohm.

In some embodiments, the coil may include a support and an electric conductor that enfolds the support portion. The support portion may include an insulating material. The support and the electric conductor may be coaxial.

In some embodiments, the electric conductor may include a metal fabric layer including a plurality metal wires that are crossed and connected with each other.

In some embodiments, one or more coils in the one or more coil assemblies may be arranged overlapped on a baseplate. The baseplate may include a plurality of holes. Each of the one or more coils may pass through at least a portion of the plurality of holes. A portion of the coil may be arranged at a first surface of the baseplate and a portion of the coil may be arranged at a second surface of the baseplate.

In some embodiments, the control circuit may include one or more frequency modulation circuits, a detuning circuit, and a preamplifier. The one or more frequency modulation circuits may be configured to adjust a resonance frequency of the coil assembly. The detuning circuit may be configured to switch a state of the coil assembly between a detuned state and a tuned state. The preamplifier may be configured to output a radio frequency signal when the coil assembly is in the tuned state.

In some embodiments, the one or more frequency modulation circuits, the detuning circuit, and the preamplifier may be integrated on a print current board (PCB).

In some embodiments, each of the one or more control circuits electrically connected with a coil may be located in a region defined by another coil adjacent to the coil.

According to another aspect of the present disclosure, a device for magnetic resonance imaging (MRI) is provided. The device for MRI may include a coil assembly. The coil assembly may be configured to receive an MR signal generated from a subject. The coil assembly may include one or more coils and one or more control circuits. Each of the one or more coils may include a first end and a second end. At least two adjacent coils may define an overlapping region. Each of the one or more control circuits may electrically connect the first end and the second end of each of at least a portion of the one or more coils. Each of the one or more control circuits may be configured to adjust an operation of at least a portion of the one or more coils that electrically connects the control circuit based on an input control signal. Each of the control circuit may include a plurality of electronic components. At least one electronic component electrically connected with one of the at least two adjacent coils may be positioned outside the overlapping region.

In some embodiments, the control circuit may include one or more frequency modulation circuits, one or more detuning circuits, and one or more preamplifiers that are integrated on a print current board (PCB).

In some embodiments, the one or more frequency modulation circuits may be configured to adjust a resonance frequency of the coil assembly. The detuning circuit may be configured to switch a state of the coil assembly between a detuned state and a tuned state. The preamplifier may be configured to output a radio frequency signal when the coil assembly is in the tuned state.

In some embodiments, an input impedance of the preamplifier may be less than 0.5 Ohm.

According to another aspect of the present disclosure, a device for magnetic resonance imaging (MRI) is provided. The device for MRI may include a coil assembly. The coil assembly may be configured to receive an MR signal generated from a subject. The coil assembly may include one or more coils and one or more control circuits. Each of the one or more coils may include a first end and a second end. Each of the one or more control circuits may electrically connect the first end and the second end of each of at least a portion of the one or more coils. Each of the one or more control circuits may be configured to adjust an operation of at least a portion of the one or more coils that electrically connects the control circuit based on an input control signal. At least one of the one or more coils may include an electric conductor. The electric conductor may include a metal fabric layer that includes a plurality metal wires crossed and connected with each other.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
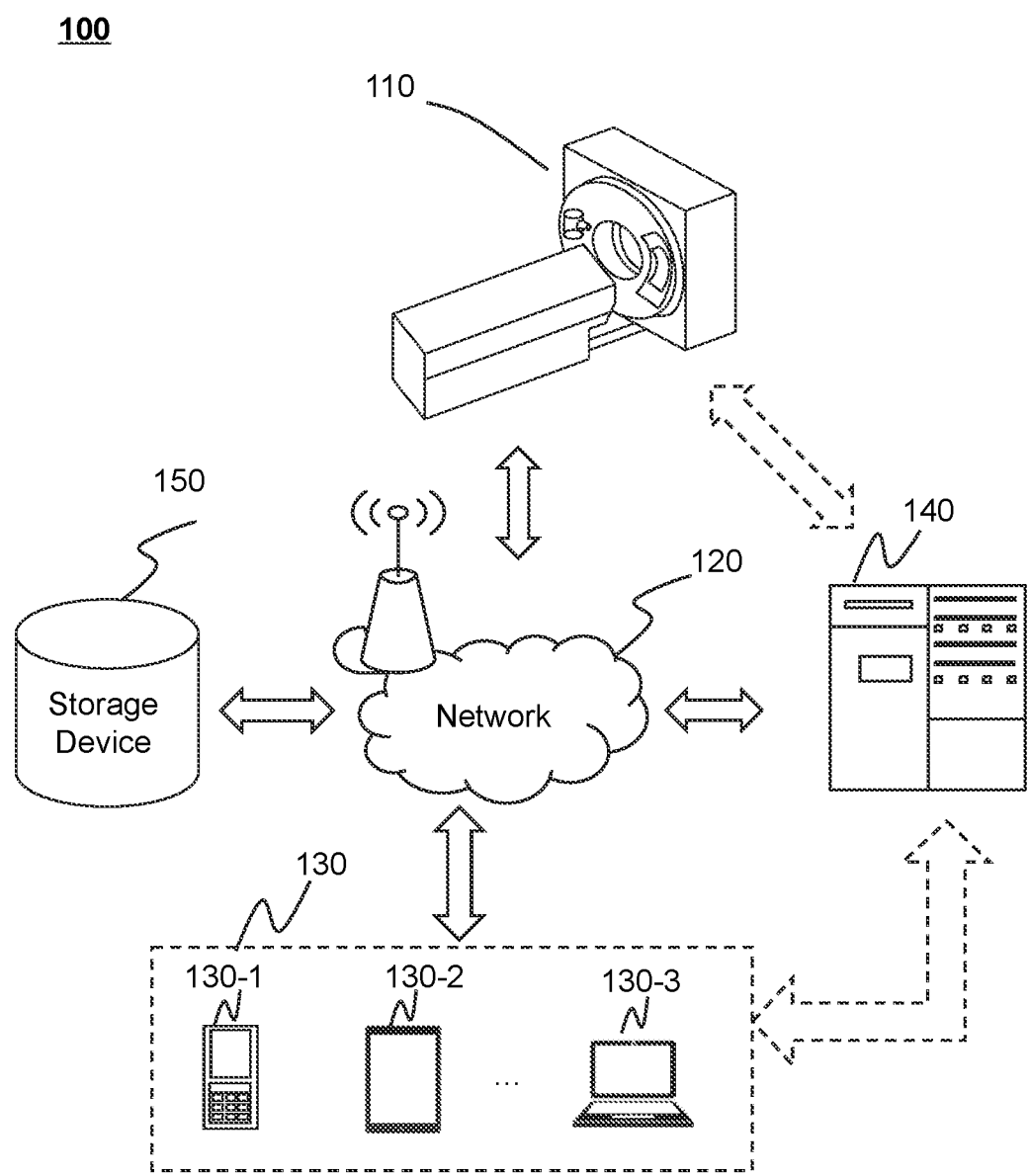
FIG. 1 is a schematic diagram illustrating an exemplary medical system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The term "image" in the present disclosure is used to collectively refer to image data (e.g., scan data, projection data) and/or images of various forms, including a two-dimensional (2D) image, a three-dimensional (3D) image, a four-dimensional (4D), etc. The term "pixel" and "voxel" in the present disclosure are used interchangeably to refer to an element of an image.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and methods for medical diagnosis training based on medical images. The medical images may be generated via a non-invasive biomedical imaging system. In some embodiments, the system may include a single modality imaging system and/or a multi-modality imaging system. The single modality imaging system may include, for example, a magnetic resonance imaging (MRI) system. The multi-modality imaging system may include, for example, an X-ray imaging-magnetic resonance imaging (X-ray-MRI) system, a single photon emission computed tomography-magnetic resonance imaging (SPECT-MRI) system, a positron emission tomography-magnetic resonance imaging (PET-MRI) system, a digital subtraction angiography-magnetic resonance imaging (DSA-MRI) system, etc. It should be noted that the imaging system described below is merely provided for illustration purposes, and not intended to limit the scope of the present disclosure.

The term "imaging modality" or "modality" as used herein broadly refers to an imaging method or technology that gathers, generates, processes, and/or analyzes imaging information of a subject. The subject may include a biological object and/or a non-biological object. The biological object may be a human being, an animal, a plant, or a portion thereof (e.g., a cell, a tissue, an organ, etc.). In some embodiments, the subject may be a man-made composition of organic and/or inorganic matters that are with or without life.

An aspect of the present disclosure relates to a system including one or more coil assemblies. The system may include a coil including a first end and a second end, and a control circuit electrically connecting the first end and the second end of the coil. The control circuit may be configured to adjust an operation of the coil based on an input control signal. According to some embodiments of the present disclosure, the operation of the coil may include a detuned state or a tuned state, and the control circuit may be configured to adjust a switch between the detuned state and the tuned state based on the input control signal.

In some embodiments, the coil may include an electric conductor. The electric conductor may include a metal fabric layer including a plurality metal wires that are crossed and connected with each other. Compared with a conventional solid electric conductor in the coil, the current carried by the metal fabric layer may have a more even distribution. Besides, adjacent coils formed by the metal fabric layer may have smaller relative coupling, a good bending property, a small unit impedance, a high gain value, and a high signal-to-noise ratio (SNR).

In some embodiments, the control circuit and the coil may be arranged independently. In this way, the coil may not include a surface mounted capacitor, a distributed capacitor, etc., which reduces a front-end circuit area of the coil, improves the flexibility of the coil, and reduces a volume and a weight of the coil. During a scan, the coil assembly may be worn on the subject due to its flexibility and good bending property, thereby improving the SNR and the scan efficiency.

In some embodiments, a coil assembly may include a plurality of coils arranged in an array, wherein adjacent coils in the same row, column, and diagonal direction may have an overlap, which decouples the adjacent coils. The array may also improve the acceleration performance of the coils, an image SNR, the use flexibility of the coil assembly, the patient comfort, and the scan efficiency.

FIG. 1 is a schematic diagram illustrating an exemplary medical system 100 according to some embodiments of the present disclosure. In some embodiments, the medical system 100 may be a single-modality system (e.g., an MRI system) or a multi-modality system (e.g., a PET-MRI system) as described elsewhere in this disclosure. In some embodiments, the medical system 100 may include modules and/or components for performing imaging and/or related analysis.

Merely by way of example, as illustrated in FIG. 1, the medical system 100 may include a medical device 110, a network 120, one or more terminals 130, a processing device 140, and a storage device 150. The components in the medical system 100 may be connected in various ways. Merely by way of example, the medical device 110 may be connected to the processing device 140 through the network 120 or directly as illustrated in FIG. 1. As another example, the terminal(s) 130 may be connected to the processing device 140 via the network 120 or directly as illustrated in FIG. 1.

In some embodiments, the medical device 110 may include a single modality device. For example, the medical device 110 may include a magnetic resonance spectroscopy (MRS) device, a magnetic resonance imaging (MRI) device (also referred to as an MR device, an MR scanner), etc. In some embodiments, the medical device 110 may include a multi-modality device. In some embodiments, the multi-modality device may be configured to acquire image data of different modalities. For example, the multi-modality device may include a first device and a second device each of which is configured to provide image data including a representation of at least one part of a subject. The first device may include a magnetic resonance spectroscopy (MRS) device, a magnetic resonance imaging (MRI) device (also referred to as an MR device, an MR scanner), etc. The second device may include a radiation source that is configured to generate and emit radiation beams to irradiate the subject in the acquisition of image data. For example, the second device may include an X-ray imaging device, a computed tomography (CT) scanner, a digital radiography (DR) scanner (e.g., a mobile digital radiography), a digital creast tomosynthesis (DBT) scanner, a digital subtraction angiography (DSA) scanner, a dynamic spatial reconstruction (DSR) scanner, an X-ray microscopy scanner. In some embodiments, the image data may be a two-dimensional (2D) imaging data, a three-dimensional (3D) imaging data, a four-dimensional (4D) imaging data, or the like, or any combination thereof. The subject accommodated in the bore of the MRI device may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, cardiac, stomach, blood vessel, soft tissue, knee, feet, or the like, or a combination thereof.

In some embodiments, the multi-modality device may be configured to acquire an image relating to at least one part of a subject and perform treatment on the at least one part of the subject, etc. For example, the multi-modality device may include the first device configured to generate an image including a representation of at least one part of a subject and the second device configured to perform a treatment on at least one part of the subject. The first device may include a magnetic resonance spectroscopy (MRS) device, a magnetic resonance imaging (MRI) device (also referred to as an MR device, an MR scanner), etc. The second device may include a treatment device. The treatment device may include a treatment radiation source that is configured to generate and emit radiation beams to irradiate the subject in the treatment. Exemplary treatment devices may include a radiotherapy device (e.g., a linear accelerator), an X-ray treatment device, etc.

The following descriptions are provided regarding an MRI device as the medical device 110 unless otherwise stated. It should be noted that the descriptions of an MRI device and the radiotherapy device in the present disclosure are merely provided for illustration, and not intended to limit the scope of the present disclosure.

The MRI device may include a magnet assembly and a radiofrequency (RF) coil assembly. The magnet assembly may generate a first magnetic field (also referred to as a main magnetic field) for polarizing the subject to be scanned. The magnet assembly may include a permanent magnet, a superconducting electromagnet, a resistive electromagnet, etc. For example, the superconducting electromagnet may include a superconducting coil. In some embodiments, the magnet assembly may include, for example, an annular superconducting magnet, which is installed in an annular vacuum chamber (e.g., a cryostat). The annular superconducting magnet may define a cylindrical space or bore that is configured to accommodate the subject and generate a constant, strong, and uniform static magnetic field (i.e., the main magnetic field) in a direction parallel to a long axis of the cylindrical space. In some embodiments, the long axis of the cylindrical space may be parallel to a direction of a couch where the subject is located entering the cylindrical space. In some embodiments, the long axis of the cylindrical space may be parallel to a direction of the Z direction of the MRI device.

In some embodiments, the magnet assembly may include a gradient coil assembly. The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the subject. In some embodiments, the X direction may be designated as a frequency encoding direction, while the Y direction may be designated as a phase encoding direction. The Z direction may be perpendicular a plane defined by the X direction and the Y direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmitting coils and/or one or more RF receiving coils. The RF transmitting coil(s) may transmit RF pulses to the subject. In some embodiments, the RF pulses may excite a nucleus in the subject to provide a resonation in the magnetic field. Under the coordinated action of the main magnetic field, the gradient magnetic field, and the RF pulses, MR signals relating to the subject may be generated. The RF receiving coils may receive MR signals from the subject. An image of the subject may be reconstructed based on the echo signals received by the RF receiving coils. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. In some embodiments, an RF receiving coil may correspond to a channel. The RF receiving coil(s) may receive a plurality of channels of MR signals from the subject. The received MR signal(s) may be sent to the processing device 140 directly or via the network 120 for image reconstruction and/or image processing.

Figure 2A:
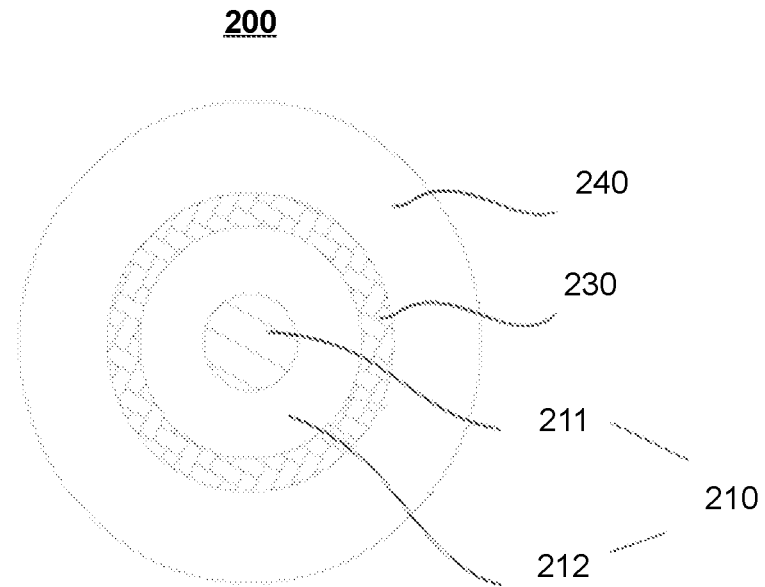
FIG. 2A is a diagram illustrating a cross-sectional view of an exemplary coil according to some embodiments of the present disclosure.
Figure 2B:
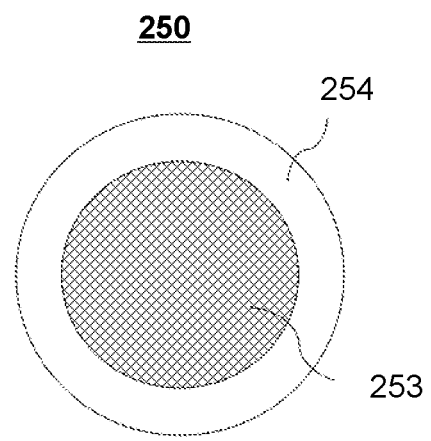
FIG. 2B is a diagram illustrating a cross-sectional view of another exemplary coil according to some embodiments of the present disclosure.

In some embodiments, a coil assembly (e.g., a gradient coil assembly, a radio frequency (RF) coil assembly) may include a plurality of coil bodies (also referred to as a coil, e.g., a coil 200 as shown in FIG. 2A, a coil 250 as shown in FIG. 2B). In some embodiments, a coil body may include one or more loops of a conductive wire (e.g., an electric conductor 230 as shown in FIG. 2A or an electric conductor 253 as shown in FIG. 2B) looped around the core of the coil body. In some embodiments, the coil assembly may include a plurality of control circuits each of which is electrically connected with one or more of the plurality of coil bodies. More descriptions for the coil assembly may found elsewhere in the present disclosure.

In some embodiments, the MRI device may include a data processing unit that may include a phase detector, an analog/digital converter, etc. The data processing unit may be used to obtain the MR signals received by the RF coil assembly and perform data processing on the MR signals to generate spectral data. In some embodiments, the MRI device may include a couch configured to support the subject. The couch may be moved to move the subject inside and outside the bore of the MRI device. In some embodiments, the MRI device may include a display unit used to display the image of the subject (or a portion thereof) on a display screen.

In some embodiments, the MRI device may be a permanent magnet MR scanner, a superconducting electromagnet MR scanner, or a resistive electromagnet MR scanner, etc., according to types of the magnetic body. In some embodiments, the MRI device may be a high-field MR scanner, a mid-field MR scanner, and a low-field MR scanner, etc., according to the intensity of the magnetic field.

The processing device 140 may process data and/or information obtained from the medical device 110, the terminal(s) 130, and/or the storage device 150. For example, the processing device 140 may direct a control circuit to adjust an operation of a coil (e.g., the gradient coil of the MRI device) of the medical system 100 based on an input control signal. In some embodiments, the processing device 140 may be a computer, a user console, a single server or a server group, etc. The server group may be centralized or distributed. In some embodiments, the processing device 140 may be local or remote. For example, the processing device 140 may access information and/or data stored in the medical device 110, the terminal(s) 130, and/or the storage device 150 via the network 120. As another example, the processing device 140 may be directly connected to the medical device 110, the terminal(s) 130 and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data, instructions, and/or any other information. In some embodiments, the storage device 150 may store data obtained from the terminal(s) 130 and/or the processing device 140. In some embodiments, the storage device 150 may store data and/or instructions that the processing device 140 may execute or use to perform exemplary methods/systems described in the present disclosure. In some embodiments, the storage device 150 may include a mass storage device, a removable storage device, a volatile read-and-write memory, a read-only memory (ROM), or the like, or any combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more other components in the medical system 100 (e.g., the processing device 140, the terminal(s) 130, etc.). One or more components in the medical system 100 may access the data or instructions stored in the storage device 150 via the network 120. In some embodiments, the storage device 150 may be directly connected to or communicate with one or more other components in the medical system 100 (e.g., the processing device 140, the terminal(s) 130, etc.). In some embodiments, the storage device 150 may be part of the processing device 140 or the medical device 110.

The terminal(s) 130 may include a mobile device 130-1, a tablet computer 130-2, a laptop computer 130-3, or the like, or any combination thereof. In some embodiments, the mobile device 130-1 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 130 may be part of the processing device 140 or the medical device 110.

The network 120 may include any suitable network that can facilitate the exchange of information and/or data for the medical system 100. In some embodiments, one or more components of the medical device 110, the terminal(s) 130, the processing device 140, the storage device 150, etc., may communicate information and/or data with one or more other components of the medical system 100 via the network 120. For example, the processing device 140 may obtain image data from the medical device 110 via the network 120. As another example, the processing device 140 may obtain user instructions from the terminal(s) 130 via the network 120.

The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the medical system 100 may be connected to the network 120 to exchange data and/or information.

It should be noted that the above description of the medical system 100 is merely provided for the purposes of illustration, and not intended to limit the scope of the present disclosure. For persons having ordinary skills in the art, multiple variations and modifications may be made under the teachings of the present disclosure. For example, the medical system 100 may include one or more additional components and/or one or more components of the medical system 100 described above may be omitted. Additionally or alternatively, two or more components of the medical system 100 may be integrated into a single component. A component of the medical system 100 may be implemented on two or more sub-components.

FIG. 2A is a diagram illustrating a cross-sectional view of an exemplary coil 200 according to some embodiments of the present disclosure. In some embodiments, the coil 200 may be used in an MRI device as described elsewhere in the present disclosure (e.g., FIG. 1 and the descriptions thereof). For example, an MRI device may include an RF coil assembly including one or more coils as shown in FIG. 2A. In some embodiments, the one or more coils may be arranged to form an array structure, e.g., array structures shown in FIGS. 7 and 8.

In some embodiments, the coil may include an electric conductor. In some embodiments, the electric conductor may include a metal fabric layer. The metal fabric layer may include a plurality metal wires that are crossed and connected with each other. In some embodiments, the electric conductor may have a hollow structure or a solid structure. For example, the electric conductor may include a hollow cylinder that includes a chamber. As another example, the metal fabric layer may be rolled into a tubular structure. In some embodiments, the coil may include a support that is located in the chamber of the electric conductor. The support may include one or more insulating materials. In some embodiments, the support and the electric conductor may be coaxial.

As shown in FIG. 2A, the coil may include a support 210, an electric conductor 230 that encompasses or wraps the support 210 (or a portion thereof), and a protective layer 240. The electric conductor 230 may be a hollow cylinder, and the support 210 may be a solid cylinder. The electric conductor 230 may include a hollow (or chamber) that is filled by the support 210. In some embodiments, the support 210 and the electric conductor 230 may be coaxial. In some embodiments, the support 210, the electric conductor 230, and the protective layer 240 may be coaxial. The support 210, the electric conductor 230, and the protective layer 240 may be flexible, so that the coil 200 may be bent along one or more certain directions.

The support 210, the electric conductor 230, and the protective layer 240 may form a coil body of the coil 200. The support 210 may serve as the core of the coil body and the electric conductor 230 may serve as an intermediate layer of the coil body, and the protective layer 240 may serve as an outer layer of the coil body, forming a coaxial structure, which reduces the thickness of the electric conductor 230. The radial dimension (e.g., the diameter) of the support 210 may be smaller than the radial dimension of the electric conductor 230. The radial dimension (e.g., diameter) of the electric conductor 230 may be smaller than the radial dimension of the electric conductor 230. In this way, the support 210 with a light-weight may fill the hollow of the electric conductor 230, which makes the electric conductor 230 as thin as possible, thereby decreasing the weight of the coil 200. As shown in FIG. 2A, along the radial direction of the coil body, the support 210 may fill the hollow of the electric conductor 230 from the center to the inner edge of the electric conductor 230 or from the edge to the center of the electric conductor 230.

The support 210 may provide a support for the electric conductor 230. In some embodiments, the support 210 may include one or more materials. The one or more materials may include a deformable material (or a flexible material), such that the support 210 may have a good bending property. The deformable material may include a fiber material, a composite material, a copolymer material, or the like, or any combination thereof. In some embodiments, the one or more materials may include an insulating material (e.g., a plastic material, a rubber material). In some embodiments, the one or more materials may include an insulating material and a deformable material. For example, the support 210 may include multiple layers. One of the multiple layers may include an insulating material and another one of the multiple layers may include a deformable material. In some embodiments, the support 210 may include one single layer that includes a material that is deformable and insulated (e.g., a plastic material, a rubber material, etc.).

As shown in FIG. 2A, the support 210 may include a deformable layer 211 and an insulating layer 212 that encloses or wraps the deformable layer 211, thereby achieving good bending performance and good insulation performance of the support 210. The deformable layer 211, the insulating layer 212, the electric conductor 230, and the protective layer 240 may be sequentially wrapped from the inside to the outside to form the coil 200. The deformable layer 211 may have an ultra-high strength, a high modulus, a high temperature resistance, a high acid resistance, a high alkali resistance, a light weight, insulation, a good aging resistance, a long life cycle, etc. For example, the deformable layer 211 may include a fiber layer that includes an aramid fiber (e.g., a para-aramid fiber (PPTA) and a meta-aramid fibers (PMIA)), a carbon fiber, a natural fiber material (e.g., a textile fiber and an animal fiber), an inorganic fiber (e.g., an asbestos fiber and a glass fiber), or the like, or any combination thereof. The insulating layer 212 may include fluorinated ethylene propylene copolymer (FEP), polytetrafluoroethylene (PTFE), tetrafluoroethylene-per-fluoroalkyl vinyl ether copolymer (PFA), or the like, or any combination thereof. The insulating layer 212 may include an insulating material (e.g., the PFA) that has a good stability, a low dielectric loss, a low dielectric constant, and a high dielectric strength.

The electric conductor 230 may include one or more conductive materials, e.g., a metal material, an alloy material, a carbon-based conductive material (e.g., a graphite, a graphene, a fullerene, etc.). In some embodiments, the electric conductor 230 may include a metal strip, a metal tube, a metal braid (i.e., a metal fabric), etc. In some embodiments, the electric conductor 230 may include a fabric layer including a plurality of conductive wires that are crossed and connected with each other. For example, the fabric layer may include a metal fabric layer that includes a plurality of metal wires that are crossed and connected with each other. The plurality of metal wires of the metal fabric layer may include a gold wire, a copper wire, an aluminum wire, a silver wire, etc., which causes the metal fabric layer to have good bending property and good conductivity. In some embodiments, the plurality of metal wires of the metal fabric layer may include a silver-plated copper wire, a tin-plated copper wire, etc. In some embodiments, the plurality of conductive wires may include carbon fiber conductive wires. In some embodiments, the plurality of conductive wires may include different materials or the same material. In some embodiments, for the coil 200, the deformable layer 211 may include the aramid material that is able to be bent repeatedly, the insulating layer 212 may include the PFA, and the electric conductor 230 may include the metal fabric layer that includes a plurality of silver-plated copper wires that provides a good conductivity.

As shown in FIG. 2A, the fabric layer (e.g., the metal fabric layer) may be rolled to form a tubular structure that is hollow. In some embodiments, the electric conductor 230 including the fabric layer with a tubular structure (also referred to as a tubular fabric layer) may improve the performance of the coil 200. The current carried by the tubular fabric layer may distribute evenly on the surface of the tubular fabric layer. Compared with a conventional electric conductor, the current carried by the tubular fabric layer may have a more even distribution, which may decrease noises of a signal received by the coil, thereby improving a stability and a reliability of signals (e.g., echo signals) received by the coil when the coil is used in an RF coil assembly of an MRI device. In some embodiments, the RF coil assembly may include multiple coils arranged on a base. Adjacent two coils each of which includes an electric conductor including the tubular fabric layer may have a smaller relative coupling action and a good bending property. In addition, a coil including an electric conductor that is formed by the tubular fabric layer may have a small unit impedance, a high gain value, and a high signal to noise ratio (SNR). In some embodiments, the tubular structure of the electric conductor 230 may decrease the weight of the coil 200.

Figure 3:
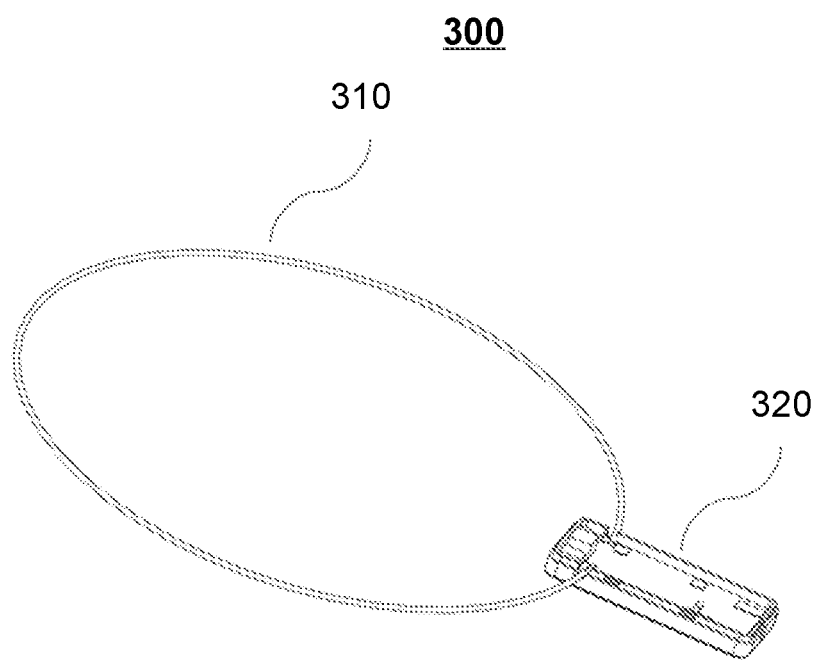
FIG. 3 is a schematic diagram illustrating an exemplary coil assembly according to some embodiments of the present disclosure.

In some embodiments, the electric conductor 230 may be bent to form a ring shape, a rectangle shape, a square shape, a butterfly shape, a saddle shape, etc. The electric conductor 230 may have a first connection end (i.e., a first end) and a second connection end (i.e., a second end). A control circuit (e.g., a control circuit 320 as shown in FIG. 3) may be electrically connected to the first connection end and the second connection end of the electric conductor 230 to form a unit of a coil assembly. In some embodiments, the control circuit may be electrically connected to the first connection end and the second connection end of the electric conductor 230 by welding, thereby realizing an electric connection between the coil 200 and the control circuit. The control circuit may be used to adjust an operation of the coil 200. For example, the operation of the coil may include a detuned state or a tuned state, and the control circuit may be configured to adjust, based on an input control signal, a switch between the detuned state and the tuned state.

The protective layer 240 may be used to protect the coil (e.g., the electric conductor 230). The protective layer 240 may enclose or wrap the electric conductor 230. The protective layer 240 may include a soft material (or a flexible material) such as leather or PU. The protective layer 240 may be soft and have good a bending property, which may fit a part of a subject (e.g., a leg, an ankle, a joint, etc.) with a specific shape when the coil 200 is used to wrap the part of the subject. Besides, the protective layer 240 may improve the comfort of the subject in a scan using an MRI device including the RF coil assembly that includes the coil 200 and simplify the scan.

Accordingly, the electrical conduction 230 with a tubular structure and the support 210 with a light weight may make the coil 200 lighter and softer, and the electric conductor 230 may have a good bending property and good conductivity. Moreover, a preparation cost for the coil 200 may be low and the production process may be easy. In addition, the control circuit may be electrically connected to the electric conductor 230, and the control circuit may be integrated into a printed circuit board (PCB), which may reduce a volume and a weight of the coil assembly. The PCB may mechanically support and electrically connect electrical or electronic components (e.g., a capacitor, an inductor, a diode) in the control circuit using conductive tracks, pads, and other features etched from one or more sheet layers of copper laminated onto and/or between sheet layers of a non-conductive substrate.

FIG. 2B is a cross-section diagram illustrating an exemplary another coil according to some embodiments of the present disclosure. As shown in FIG. 2B, the coil 250 may be the same as or similar to the coil 200. For example, the coil 250 may include an electric conductor 253 and a protective player 254 that encompasses or wraps the electric conductor 253. Different from the coil 200, the electric conductor 253 may be a solid structure. In some embodiments, the electric conductor 253 may include a solid formed by a fabric layer (e.g., the metal fabric layer). The metal fabric layer may include a plurality of metal wires that are crossed and connected with each other.

FIG. 3 is a schematic diagram illustrating at least a portion of an exemplary coil assembly 300 according to some embodiments of the present disclosure. As shown in FIG. 3, the coil assembly 300 may include one or more units each of which includes a coil 310 (also referred to as a coil body) and a control circuit 320 electrically connected with a first end and a second end of the coil 310.

The coil 310 may be bent to form a suitable shape, e.g., a circular shape, a rectangular shape, a polygonal shape, an oval shape, etc. The cross-sectional view of the coil 310 may be in a circular shape, a rectangular shape, a polygonal shape, an oval shape, etc. More descriptions for the coil 310 may be found elsewhere in the present disclosure (e.g., FIG. 2A and FIG. 2B, and the descriptions thereof). For example, the coil 310 may include an electric conductor. The electric conductor may be composed of a metal fabric. For example, a metal fabric layer may be rolled to form the electric conductor. The metal fabric layer may include a plurality metal wires that are crossed and connected with each other. In some embodiments, the electric conductor may have a hollow structure or a solid structure. For example, the electric conductor may include a hollow cylinder that includes a chamber. In some embodiments, the coil 310 may include a support that is located in the chamber of the electric conductor. The support may include an insulating material. In some embodiments, the coil 310 may include a protective layer encompassing the electric conductor.

The control circuit 320 may be configured to adjust an operation of the coil 310 based on an input control signal. In some embodiments, the operation of the coil 310 may indicate a state of the coil 310. The state of the coil 310 may include a working mode and an idle mode. The working mode may indicate that the coil 310 is able to receive signals (e.g., MR signals). The idle mode may indicate that the coil 310 is unable to receive signals (e.g., MR signals). The control circuit 320 and the coil 310 may form a resonant tank (also referred to as an oscillating circuit) when the coil 310 is filled with current. The operation of the coil 310 may also be referred to as an operation of the resonant rank or the coil assembly 300. For example, the operation of the coil 310 may include a detuned state or a tuned state of the oscillating circuit. The control circuit 320 may be configured to adjust a switch between the detuned state and the tuned state of the resonant tank based on the input control signal. As used herein, the detuned state refers to that a frequency of the resonant tank deviates from a resonant frequency of the resonant tank; and the tuned state refers to that a frequency of the resonant tank is equal to a resonant frequency of the resonant tank.

In some embodiments, the coil assembly 300 may be used as an RF receiving coil assembly. When a subject is located in a magnetic field of the MRI device for imaging, an RF transmitting coil assembly may transmit RF pulses to the subject and the RF receiving coil assembly (i.e., the coil assembly 300) may need to be at the detuned state. The RF pulses may excite nuclear resonance at a specific frequency in the subject under the magnetic field to generate MR signals (e.g., echo signals). Then the RF receiving coil assembly (i.e., the coil assembly 300) at the detuned state may be controlled by the control circuit 320 to switch from the detuned state to the tuned state to receive the MR signals generated by the subject. At this time, the MR signal received by the coil assembly 310 may be adjusted and/or processed by the control circuit 320 to output an RF signal, which may be used to generate an image of the subject.

In other words, when the RF receiving coil assembly receives MR signals (i.e., the coil 310 is in a working mode), for example, when an RF transmitting coil assembly does not transmit RF pulses, the coil assembly 300 may be set to be in the tuned state based on an input resonance signal; and when the coil assembly 300 does not receive MR signals (i.e., the coil 310 is in the idle mode), for example, when an RF transmitting coil assembly transmits RF pulses, the coil assembly 300 may be set to be in the detuned state based on an input detuning signal. Accordingly, an inductive coupling action may be not involved between the RF receiving coil assembly and the RF transmitting coil assembly.

In some embodiments, the operation of the coil 310 may be related to one or more operation parameters, such as the resonant frequency of the resonant tank, the impedance of the resonant tank, etc. The control circuit 320 may control the resonant frequency, the impedance, etc., of the resonance tank of the coil assembly 300.

In some embodiments, the control circuit 320 may have a direct current (DC) input terminal for inputting the input control signal. That is, the coil 310 may be adjusted to switch between the detuned state and the tuned state based on the input control signal inputted through the DC input terminal.

In some embodiments, the control circuit 320 may include one or more electronic components. In some embodiments, the one or more electronic components may include one or more frequency modulation circuits (e.g., a frequency modulation circuit 421), one or more detuning circuits (e.g., a detuning circuit 422), one or more preamplifiers (e.g., a preamplifier 413), etc. In some embodiments, the one or more electronic components of the control circuit 320 may be integrated into a circuit board, such as a PCB. For example, the one or more frequency modulation circuits, the one or more detuning circuits, the preamplifiers, etc., may be integrated into one single circuit board, such as a PCB. The control circuit 320 and the coil 310 may be arranged independently. The electronic components of the control circuit 320 may be all electrically connected and mechanically fastened to the circuit board. Thus, the electronic components of the control circuit 320 may be mechanically separated from the coil 310. The coil 310 may not include one or more electronic components, such as a surface-mounted capacitor, a distributed capacitor, etc., which reduces a front-end circuit area of the coil 310, improves the flexibility of the coil 310, and reduces a volume and a weight of the coil 310. Therefore, when the coil 310 is worn on a human body, the coil 310 may be soft and easy to fold, have high folding endurance, and be relatively light and comfortable.

In some embodiments, the coil assembly 300 may include multiple units each of which includes the coil 310 and the control circuit 320 that is electrically connected with the coil 310. In other words, the count (or number) of coils may be the same as the count of control circuits in the coil assembly 300. In some embodiments, the coil assembly 300 may include multiple units each of which includes more than one coils and one single control circuit. In other words, the count (or number) of coils may exceed the count of control circuits in the coil assembly 300. Each of the control circuits may electrically connect the first end and the second end of each of at least a portion of the coils. Each of the control circuits may be configured to adjust the operation of at least a portion of the coils that electrically connect the control circuit based on the input control signal. In some embodiments, at least two adjacent coils may define an overlapping region. Each of the control circuit may include a plurality of electronic components, and at least one electronic component electrically connected with one of the at least two adjacent coils may be positioned outside the overlapping region. In some embodiments, the first end and the second end of a coil may be electrically connected with a control circuit. A region may be defined by the coil and the control circuit. Two and more coils may be overlapped to form the overlapping region. The control circuit electrically connected with one of the two or more coils may be positioned in a region defined by another one of the two or more coils and outside the overlapping region.

In some embodiments, the coils may be arranged as an array. For example, the coils may be physically connected with a base plate as an array. More descriptions for the arrangement of multiple coils may be found elsewhere in the present disclosure (e.g., FIGS. 7 and 15, and the descriptions thereof).

According to some embodiments of the present disclosure, the electronic components associated with the coil assembly 300 may be integrated into a circuit board, and no electronic component may be located in a coil in the coil assembly 300, which may improve an integration degree of the front-end circuit of the coil, improve the flexibility of the coil, reduce a preparation cost of the coil assembly 300, and simplify the preparation process of the coil assembly 300. During a scan operation on a subject, the coil 310 may be worn on the subject, which improves patient comfort and simplifies the scan operation.

According to some embodiments of the present disclosure, each of the one or more coils in the coil assembly may be electrically connected with a control circuit. The one or more control circuits in the coil assembly may be distributed at different locations as the arrangement of the one or more coils in the coil assembly. Conventionally, a plurality of control circuits of multiple transmission channels may be integrated in a central position, which may cause a large protrusion and local overheating at the central position. The control circuits 320 herein may be scattered in multiple locations, which may prevent the large protrusion and avoid damage to the control circuits of the coil assembly due to an excessive power generated by the control circuits.

According to some embodiments, the coil assembly 300 may be used in an MRI device (e.g., the MRI device described in FIG. 1). The MRI device may include the coil assembly 300 including the coil 310, the control circuit 320, and an RF transmitting coil assembly. The coil 310 may serve as an RF receiving coil assembly and may be used to receive the MR signal. In some embodiments, a process for controlling the MRI device may be implemented in the medical system 100 illustrated in FIG. 1. For example, the process may be stored in the storage device 150 of the medical system 100 in the form of instructions, and invoked and/or executed by the processing device 140. In some embodiments, the processing device 140 may control the RF transmitting coil assembly to emit signals that may excite a nucleus with a specific frequency in a subject to provide resonation, and direct the control circuit 320 to make the coil 310 be in a detuned state. The processing device 140 may direct the control circuit 320 to switch the coil 310 in the detuned state to the tuned state based on the input control signal (i.e., a resonance signal). In some embodiments, the processing device 140 may control the RF transmitting coil to emit the RF pulse to the subject, and direct the control circuit 320 to switch the coil 310 to the detuned state based on the input control signal (i.e., a detuning signal).

In some embodiments, the coil assembly 300 may include a plurality of coils and a plurality of control circuits. Each of the plurality of coils may be connected to one of the control circuits and controlled by the connected control circuit 320 independently. For example, each of the plurality of control circuits 320 may electrically connect a first end and a second end of each of one or more of the plurality of coils. The plurality of control circuits may be independent of each other. In this way, the plurality of control circuits may be configured to adjust operations of the plurality of coils independently, for example, a detuned state and a tuned state. For example, one or more of the plurality of coils may be switched to the detuned state or the tuned state.

In some embodiments, the plurality of coils may include a flexible coil having a conventional size. Multiple flexible coils may form an array structure. The coil assembly 300 including the array may scan different parts of a subject by wrapping the different parts. For example, when scanning a wrist joint with a small size, the wrapping diameter of the array may be reduced, which may result in an over-coupling. At this time, an optimal decoupling state of the coil assembly may change, and the over-coupling may reduce the SNR, which affects the image quality. However, the control circuit in the foregoing embodiments of the present application may provide a wider preamp decoupling. Furthermore, by adopting a preamplifier with a lower input impedance, the plurality of coils may have a more flexible structure. For example, the plurality of coils may be in an under-coupled array or an over-coupled array. Therefore, the coil assembly may be used in different coupling situations without affecting the SNR and image quality.

Figure 4:
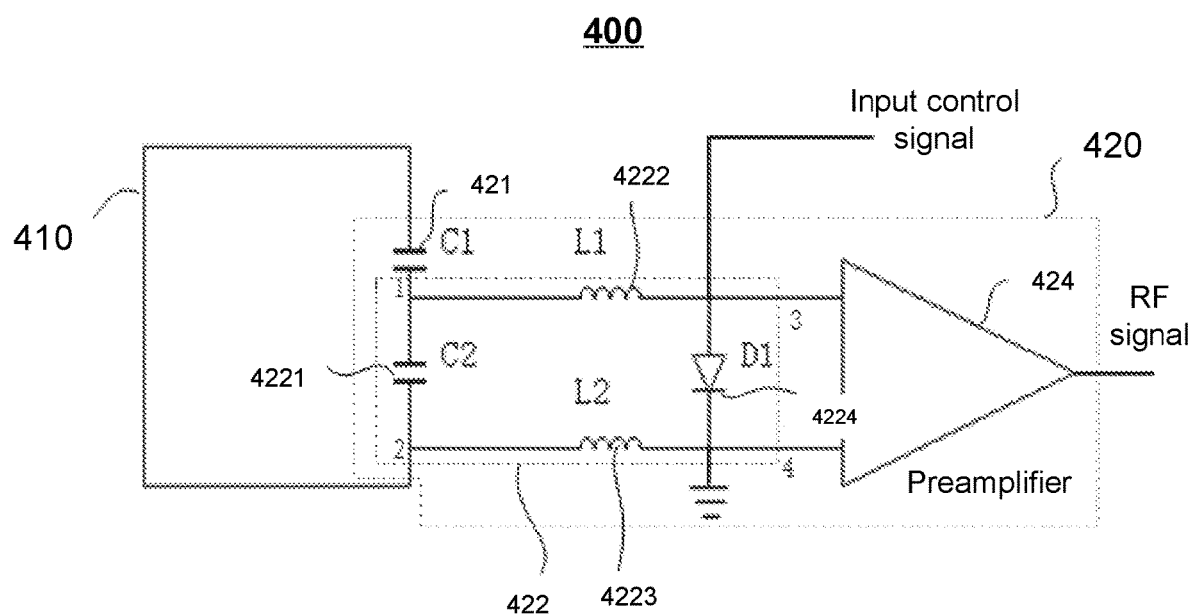
FIG. 4 is a schematic diagram illustrating an exemplary coil assembly according to some embodiments of the present disclosure.

FIG. 4 is a schematic diagram illustrating at least a portion of an exemplary coil assembly according to some embodiments of the present disclosure. As shown in FIG. 4, the coil assembly 400 may include one or more units each of which includes a coil 410 and a control circuit 420. The control circuit 420 may electrically connect a first end and a second end of the coil 410. In some embodiments, the coil 410 may be the same as or similar to the coil 200 and/or the coil 250. More descriptions for the coil 410 may be found elsewhere in the present disclosure.

In some embodiments, when the coil assembly 400 is used in an MRI device, the coil assembly 400 may be used as an RF receiving coil assembly that is configured to receive MR signals when the MRI device performs an image acquisition of a subject. The MRI device may include an RF transmitting coil assembly configured to emit and transmit RF pulse signals to the subject. The RF transmitting coil assembly and the RF receiving coil assembly may have an inductance property and are independent of each other. The RF transmitting coil assembly may emit signals (e.g., RF pulses) that may excite a nucleus with a specific frequency in a subject to provide resonation. The RF receiving coil assembly may receive an MR signal (e.g., an echo signal) emitted from the subject.

There may be an inductive coupling between different RF coils (e.g., the RF receiving coil of the RF receiving coil assembly and the RF transmitting coil of the RF transmitting coil assembly), and a magnetic flux variation of an RF coil (e.g., the RF transmitting coil) may result in a change of magnetic flux of a nearby RF coil (e.g., the RF receiving coil). When different RF coils (e.g., the RF receiving coil and the RF transmitting coil) are close to each other, the resonance frequency of at least one of the different RF coils may deviate from a desired resonance frequency, which may cause the RF receiving coil failing to receive a desired MR signal.

In some embodiments, if the coil assembly 400 is in a working mode, e.g., the coil assembly 400 receives signals (e.g., MR signals), the control circuit 420 may switch a state of the coil assembly 400 to the tuned state based on an input control signal (i.e., a resonance signal) to facilitate the coil 410 to receive the MR signal. The control circuit 420 (e.g., a preamplifier) may be used to process the MR signal and output an RF signal (i.e., the processed MR signal). The RF signal may be transmitted to a data processing unit (e.g., the data processing unit described in FIG. 1) for further processing to generate an image of the subject.

In some embodiments, if the coil assembly 400 is in an idle mode, e.g., the coil assembly 400 does not receive signals (e.g., MR signals), and the coil assembly 400 emits the RF pulse, the control circuit 420 may switch the state of the coil assembly 400 to the detuned state based on an input control signal (i.e., a detuning signal). In the detuned state, the coil 410 (i.e., the RF receiving coil) and the RF transmitting coil may be decoupled, thereby avoiding a mutual effect between different coils (i.e., the RF receiving coil and the RF transmitting coil).

The control circuit 420 may include a frequency modulation circuit 421, a detuning circuit 422, and a preamplifier 424. The frequency modulation circuit 421 may be configured to adjust a resonance frequency of the coil assembly 400. As used herein, the resonance frequency of a coil assembly refers to a resonance frequency of a resonance tank (or an oscillating circuit) formed by the coil assembly (i.e., the coil 410 and the control circuit 420). When the inductive reactance of the resonance tank is equal to the capacitive reactance of the resonance tank, and the inductive reactance of the resonance tank is in an inverse direction to the capacitive reactance of the resonance tank, the inductive reactance of the resonance tank and the capacitive reactance of the resonance tank may be cancelled and the resonance tank may be a circuitry of pure resistance, a frequency of a signal (e.g., an MR signal) detected or received by the resonance tank is equal to the resonance frequency of the coil assembly 400, and the coil assembly 400 (or the resonance tank (or the oscillating circuit) formed by the coil assembly 400) is in a tuned state. The detuning circuit 422 may be configured to switch a state of the coil assembly 400 between a detuned state and a tuned state. The preamplifier 424 may be configured to output an RF signal when the coil assembly 400 is in the tuned state. In some embodiments, the frequency modulation circuits 411, the detuning circuit 422, and the preamplifier 424 may be integrated on a circuit board, e.g., a PCB.

As shown in FIG. 4, a first end of the frequency modulation circuit 421 may electrically connect the first end of the coil 410. A first end (denoted by 1) of the detuning circuit 422 may electrically connect a second end (denoted by 2) of the frequency modulation circuit 421, and the second end of the detuning circuit 422 may electrically connect the second end of the coil 410. A first input end of the preamplifier 424 may electrically connect a third end (denoted by 3) of the detuning circuit 422, and a second input end of the preamplifier 424 may electrically connect a fourth end (denoted by 4) of the detuning circuit 422. An input control signal (e.g., a DC signal) may be inputted to the detuning circuit 422 via the third end of the detuning circuit 422. The fourth end of the detuning circuit 422 may have a grounded connection. An output end of the preamplifier 424 may be configured to output an RF signal when the coil is in the tuned state.

The frequency modulation circuit 421 may include at least one tuning capacitor C1. The resonance frequency of a resonance circuit including the tuning capacitor C1 may be adjusted by adjusting the capacitance of the tuning capacitor C1. For example, the capacitance of the tuning capacitor C1 may be increased to decrease the resonance frequency to the desired resonance frequency; and the capacitance of the tuning capacitor C1 may be decreased to increase the resonance frequency to the desired resonance frequency. The MR signals with different frequencies may be received by the coil assembly 400 by adjusting the resonance frequency of the resonance circuit. An MR signal with the same frequency as the desired resonance frequency of the resonance circuit may be received by the coil assembly 400 in the tuned state. When the MR signal with the same frequency as the desired resonance frequency of the resonance circuit, the resonance circuit may be in the tuned state; when the MR signal with the frequency different from the desired resonance frequency of the resonance circuit, the resonance circuit may be in the detuned state. In some embodiments, the frequency modulation circuit 421 may adjust the resonance frequency of the resonance circuit based on the frequency of RF pulses emitted by an RF transmitting coil assembly. The RF transmitting coil assembly may emit signals (e.g., RF pulses) that may excite a nucleus with a specific frequency same as the frequency of the RF pulses in a subject to provide resonation. The resonation of the nucleus may generate an MR signal. The MR signal may be detected by the coil 410 when the frequency of the MR signal is the same as the desired resonance frequency of the resonance circuit of the RF receiving coil assembly (i.e., the coil assembly 400). The frequency of the MR signal may be the same as the frequency of the RF pulses. The resonance frequency of the resonance circuit may be adjusted such that the desired resonance frequency may be the same as the frequency of the RF pulses.

In some embodiments, the detuning circuit 422 may include a capacitor 4221 (C2) (also referred to as a matching capacitor), a first inductor 4222 (L1), a second inductor 4223 (L2), and a diode 4224 (D1). A first end of the capacitor 4221 may electrically connect the second end of the frequency modulation circuit 421, and a second end of the capacitor 4221 may electrically connect the second end of the coil 410. A first end of the first inductor 4222 may electrically connect the first end of the capacitor 4221, and a second end of the first inductor 4222 may electrically connect the first input end of the preamplifier 424. A first end of the second inductor 4223 may electrically connect the second end of the capacitor 4221, and a second end of the second inductor 4223 may electrically connect the second input end of the preamplifier 424. A positive pole of the diode 4224 may electrically connect the first input end of the preamplifier 424, and a negative pole of the diode 4224 may electrically connect the second input end of the preamplifier 424. The positive pole of the diode 4224 may be an input end of the input control signal.

In some embodiments, the input end of the control circuit 420 may input a forward voltage (i.e., a detuning signal), the diode 4224 may conduct. When the diode 4224 conducts, the capacitor 4221, the first inductor 4222, and the second inductor 4223 may form a parallel circuit (also referred to as a detuning circuit), i.e., the resonance circuit of the coil assembly 400 may be the parallel circuit. The parallel circuit may be a circuitry of pure resistance and the coil 410 may be disconnected in the parallel circuit (i.e., in an idle mode). The actual resonance frequency of the parallel circuit deviates from a desired resonance frequency that is determined or adjusted by the frequency modulation circuit 421. The actual resonance frequency of the parallel circuit may deviate from the frequency of the MR signal that is the same as the desired resonance frequency that is determined or adjusted by the frequency modulation circuit 421, such that the parallel circuit may be in a detuned state and fail to receive an MR signal, thereby decreasing a coupling interference among different coils (e.g., the RF transmitting coil and the RF receiving coil).

In some embodiments, the parallel circuit in the detuned state may form a high-impedance between the parallel circuit and the input ends of the preamplifier 424, thereby isolating the MR signal from the preamplifier 424 and protecting the preamplifier 424 from being damaged.

In some embodiments, the input end of the control circuit 420 inputs a reverse voltage (i.e., a resonance signal), the diode 4224 may not conduct. When the diode 4224 does not conduct, the coil 410, the frequency modulation circuit 421 (e.g., the tuning capacitor C1), and the capacitor 4221 may form a resonance circuit. The resonance circuit may be not a circuitry of pure resistance and the coil 410 may be connected in the resonance circuit (i.e., in a working mode). The actual resonance frequency may be the same as the desired resonance frequency that is determined or adjusted by the frequency modulation circuit 421 and the resonance circuit may be in the tuned state. The coil assembly 400 (e.g., the coil 410) in the tuned state may receive the MR signal with the frequency that is the same as the actual resonance frequency or the desired resonance frequency and transmit the received MR signal to the preamplifier 424 for amplification. In some embodiments, the resonance frequency of the resonance circuit may be adjusted by adjusting the capacitance of the tuning capacitor C1, so that MR signals corresponding to different resonance frequencies may be received by the coil 410. The preamplifier 424 may amplify an MR signal and output a corresponding RF signal.

In some embodiments, when the diode 4224 does not conduct and the coil assembly 400 (e.g., the coil 410) is in the tuned state, by adjusting the capacitance of the capacitor 4221 (C2), an impedance of the resonant circuit may be adjusted to an optimum impedance of the input end of the preamplifier 424. As used herein, the impedance of the input end of the preamplifier 424 may also be referred to as an input impedance of the preamplifier 424. The input impedance of the preamplifier 424 may be decreased by increasing the capacitance of the capacitor 4221 (C2). In some embodiments, the input impedance of the preamplifier 424 may be adjusted to be matched with the output impedance of the preamplifier 424, such that noises in an outputted signal of the preamplifier 424 may be reduced. As used herein, the input impedance and the output impedance of the preamplifier 424 may be matched such that an output power of the preamplifier 424 is maximum. In some embodiments, a difference between the input impedance and the output impedance of the preamplifier 424 may be less than a threshold, such as 0, or 0.5 Ohm, or 0.3 Ohm, etc.

Figure 5:
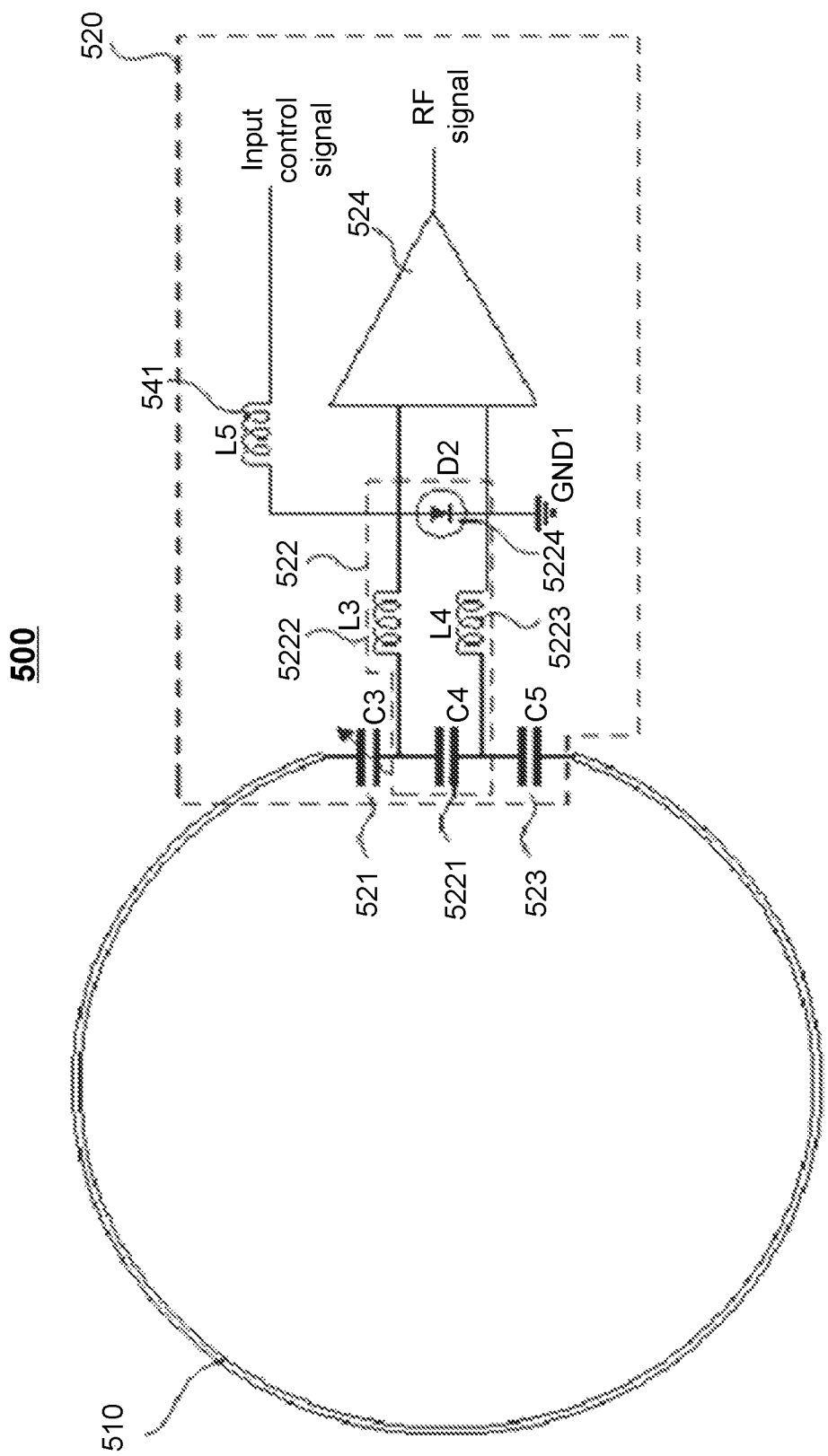
FIG. 5 is a schematic diagram illustrating another exemplary coil assembly according to some embodiments of the present disclosure.

FIG. 5 is a schematic diagram illustrating an exemplary coil assembly according to some embodiments of the present disclosure. As shown in FIG. 5, the coil assembly 500 may include one or more units each of which includes a coil 510 and a control circuit 520. The control circuit 520 may electrically connect a first end and a second end of the coil 510. In some embodiments, the coil 510 may be the same as or similar to the coil 200 and/or the coil 250. More descriptions for the coil 510 may be found elsewhere in the present disclosure.

In some embodiments, when the coil assembly 500 is used in an MRI device, the coil assembly 500 may be used as an RF receiving coil assembly that is configured to receive MR signals when the MRI device performs an image acquisition of a subject. The MRI device may include an RF transmitting coil assembly configured to emit and transmit RF pulse signals to the subject. In some embodiments, if the coil assembly 500 is in a working mode, e.g., the coil assembly 500 receives signals (e.g., MR signals), the control circuit 520 may switch a state of the coil assembly 500 to the tuned state based on an input control signal (i.e., a resonance signal) to facilitate the coil 510 to receive the MR signal. The control circuit 520 (e.g., a preamplifier) may be used to process the MR signal and output an RF signal (i.e., the processed MR signal). The RF signal may be transmitted to a data processing unit (e.g., the data processing unit described in FIG. 1) for further processing to generate an image of the subject. In some embodiments, if the coil assembly 500 is in an idle mode, e.g., the coil assembly 500 does not receive signals (e.g., MR signals), and the coil assembly 500 emits the RF pulse, the control circuit 520 may switch the state of the coil assembly 500 to the detuned state based on an input control signal (i.e., a detuning signal). In the detuned state, the coil 510 (i.e., the RF receiving coil) and the RF transmitting coil may be decoupled, thereby avoiding a mutual effect between different coils (i.e., the RF receiving coil and the RF transmitting coil).

The control circuit 520 may include a first frequency modulation circuit 521, a detuning circuit 522, a second frequency modulation circuit 523, and a preamplifier 524. The first frequency modulation circuit 521 and the second frequency modulation circuit 523 may be configured to adjust a resonance frequency of a resonance circuit formed by the coil assembly 500. The detuning circuit 522 may be configured to switch a state of the coil assembly 500 between a detuned state and a tuned state. The preamplifier 524 may be configured to output a signal when the coil assembly 500 is in the tuned state. In some embodiments, the first frequency modulation circuit 521, the detuning circuit 522, the second frequency modulation circuit 523, and the preamplifier 524 may be integrated on a circuit board, e.g., a PCB.

As shown in FIG. 5, a first end of the first frequency modulation circuit 521 may electrically connect the first end of the coil 510. A first end of the detuning circuit 522 may electrically connect a second end of the first frequency modulation circuit 521. A first end of the second frequency modulation circuit 523 may electrically connect a second end of the detuning circuit 522, and a second end of the second frequency modulation circuit 523 may electrically connect the second end of the coil 510. A first input end of the preamplifier 524 may electrically connect a third end of the detuning circuit 522, and a second input end of the preamplifier 524 may electrically connect a fourth end of the detuning circuit 522. An input control signal (e.g., a DC signal) may be inputted to the detuning circuit 522 via the third end of the detuning circuit 522. The fourth end of the detuning circuit 522 may have a grounded connection. An output end of the preamplifier 524 may be configured to output an RF signal when the coil 510 is in the tuned state.

The first frequency modulation circuit 521 may include at least one tuning capacitor C3. The second frequency modulation circuit 523 may include at least one tuning capacitor C5. The resonance frequency of a resonance circuit including the tuning capacitor C3 and the tuning capacitor C5 may be adjusted by adjusting the capacitance of the tuning capacitor C3 and/or the tuning capacitor C5. For example, the capacitance of the tuning capacitor C3 and/or the tuning capacitor C5 may be increased to decrease the resonance frequency to the desired resonance frequency; and the capacitance of the tuning capacitor C3 and/or the tuning capacitor C5 may be decreased to increase the resonance frequency to the desired resonance frequency. As another example, the capacitance of the tuning capacitor C3 may be increased and the capacitance of the tuning capacitor C5 may be decreased to decrease the resonance frequency to the desired resonance frequency; and the capacitance of the tuning capacitor C3 may be decreased and the capacitance of the tuning capacitor C5 may be increased to increase the resonance frequency to the desired resonance frequency. As still another example, the capacitance of the tuning capacitor C3 may be decreased and the capacitance of the tuning capacitor C5 may be increased to decrease the resonance frequency to the desired resonance frequency; and the capacitance of the tuning capacitor C3 may be increased and the capacitance of the tuning capacitor C5 may be decreased to increase the resonance frequency to the desired resonance frequency. The corresponding MR signal may be detected by the coil 510. The MR signal then may be processed and outputted by the preamplifier 524.

In some embodiments, the detuning circuit 522 may include a capacitor 5221 (C4), a first inductor 5222 (L3), a second inductor 5223 (L4), and a diode 5224 (D2). A first end of the capacitor 5221 may electrically connect the second end of the first frequency modulation circuit 521, and a second end of the capacitor 5221 may electrically connect the first end of the second frequency modulation circuit 523. A first end of the first inductor 5222 may electrically connect the first end of the capacitor, and a second end of the first inductor 5222 may electrically connect the first input end of the preamplifier 524. A first end of the second inductor 5223 may electrically connect the second end of the capacitor 5221, and a second end of the second inductor 5223 may electrically connect the second input end of the preamplifier 524. A positive pole of the diode 5224 may electrically connect the first input end of the preamplifier 524, and a negative pole of the diode 5224 may electrically connect the second input end of the preamplifier 524. The positive pole of the diode 5224 may be an input end of the input control signal.

In some embodiments, when the input end of the control circuit 520 inputs a forward voltage (i.e., a resonance signal), the diode 5224 may conduct. When the diode 5224 conducts, the capacitor 5221, the first inductor 5222, and the second inductor 5223 may form a parallel circuit (also referred to as a detuning circuit), i.e., the resonance circuit of the coil assembly 500 may be the parallel circuit. The actual resonance frequency of the parallel circuit deviates from a desired resonance frequency that is determined or adjusted by the first frequency modulation circuit 521 and/or the second frequency modulation circuit 523. The actual resonance frequency of the parallel circuit may deviate from the frequency of the MR signal that is the same as the desired resonance frequency that is determined or adjusted by the first frequency modulation circuit 521 and/or the second frequency modulation circuit 523, such that the parallel circuit may be in a detuned state and fail to receive an MR signal, thereby decreasing a coupling interference among different coils (e.g., the RF transmitting coil and the RF receiving coil). In some embodiments, the parallel circuit in the detuned state may form a high-impedance between the parallel circuit and the input ends of the preamplifier 524, thereby isolating the MR signal from the preamplifier 524 and protecting the preamplifier 524 from being damaged. Merely by way of example, when the input control signal is a 150 milliamperes (mA) DC signal, the diode 5224 may be conducing. At this time, the capacitor 5221, the first inductor 5222, and the second inductor 5223 may form a parallel circuit in the detuned state, which results in high resistance.

In some embodiments, when the input end of the control circuit 520 inputs a reverse voltage (i.e., a detuning signal), the diode 5224 may not conduct. When the diode 5224 does not conduct, the coil 510, the first frequency modulation circuit 521 (e.g., the tuning capacitor C3), the second frequency modulation circuit 523 (e.g., the tuning capacitor C4), and the capacitor 5221 may form a resonance circuit. The actual resonance frequency may be the same as the desired resonance frequency that is determined or adjusted by the first frequency modulation circuit 521 and/or the second frequency modulation circuit 523, and the resonance circuit may be in the tuned state. The coil assembly 500 (e.g., the coil 510) in the tuned state may receive the MR signal with the frequency that is the same as the actual resonance frequency or the desired resonance frequency and transmit the received MR signal to the preamplifier 524 for amplification. In some embodiments, the resonance frequency of the resonance circuit may be adjusted by adjusting the capacitance of the tuning capacitor C3 and/or the tuning capacitor C5, so that MR signals corresponding to different resonance frequencies may be received by the coil 510. The preamplifier 524 may amplify an MR signal and output a corresponding RF signal.

In some embodiments, when the diode 5224 does not conduct, by adjusting the capacitance of the capacitor 5221, an impedance of the resonant circuit may be adjusted to an optimum impedance of the input end of the preamplifier 524. As used herein, the impedance of the input end of the preamplifier 524 may also be referred to as an input impedance of the preamplifier 524. The input impedance of the preamplifier 524 may be decreased by increasing the capacitance of the capacitor 5221 (C4). In some embodiments, the input impedance of the preamplifier 524 may be adjusted to be matched with the output impedance of the preamplifier 524, such that noises in an outputted signal of the preamplifier 524 may be reduced. As used herein, the input impedance and the output impedance of the preamplifier 524 may be matched such that an output power of the preamplifier 524 is maximum. In some embodiments, a difference between the input impedance and the output impedance of the preamplifier 524 may be less than a threshold, such as 0, or 0.5 Ohm, or 0.3 Ohm, etc.

In some embodiments, the coil assembly 500 may further include an inductor 541 (L5) (also referred to as a third inductor). A first end of the inductor 541 may electrically connect the positive pole of the diode 5224, and a second end of the inductor 541 may be an input end of the input control signal. The input control signal may pass through the inductor 541 and an alternating current (AC) signal included in the input control signal may be filtered by the inductor 541, and the input control signal without the AC signal may be configured to control a conduction of the diode 5224.

Figure 6:
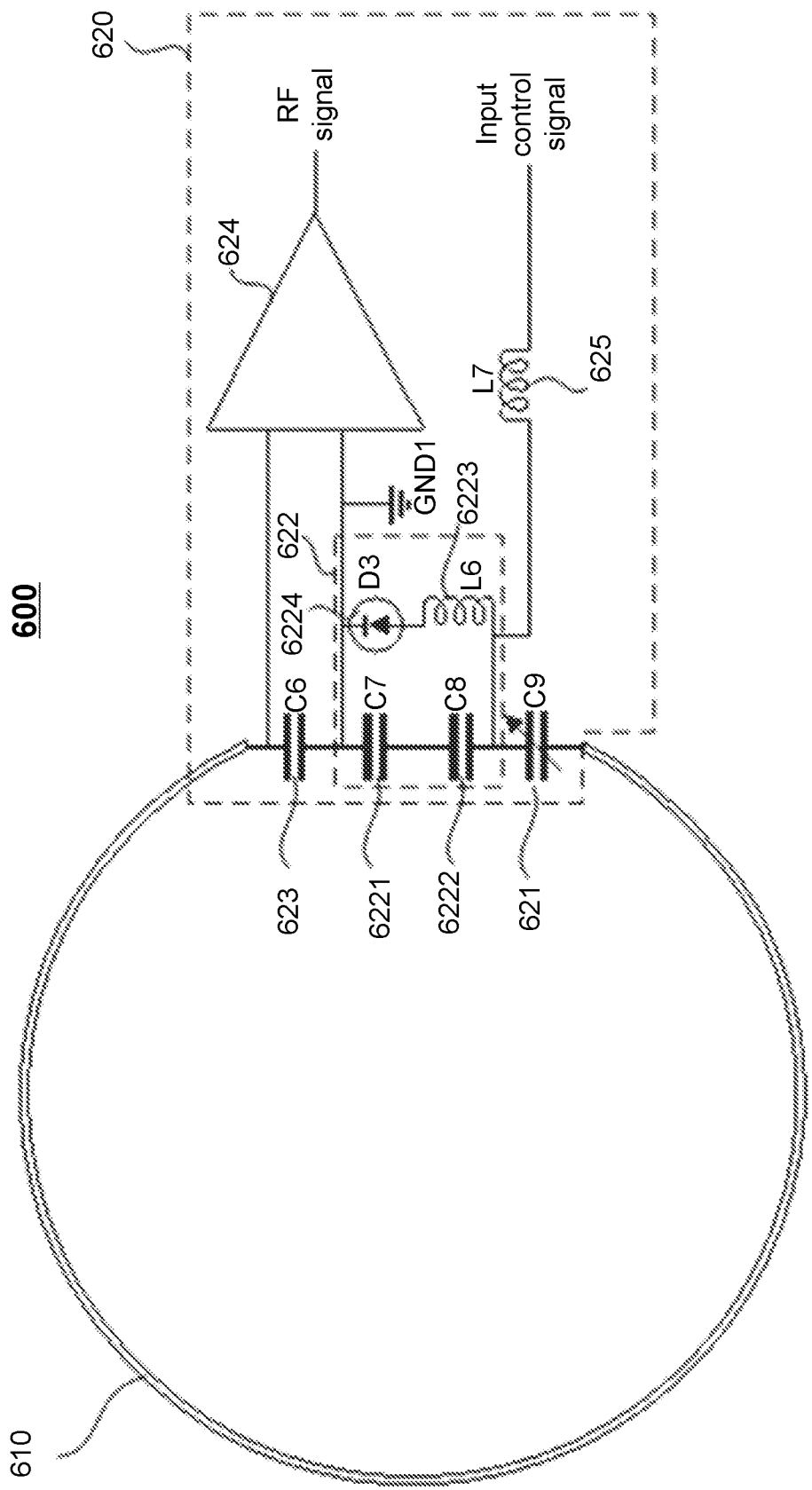
FIG. 6 is a schematic diagram illustrating another exemplary coil assembly according to some embodiments of the present disclosure.

FIG. 6 is a schematic diagram illustrating an exemplary coil assembly according to some embodiments of the present disclosure. As shown in FIG. 6, the coil assembly 600 may include one or more units each of which includes a coil 610 and a control circuit 620. The control circuit 620 may electrically connect a first end and a second end of the coil 610. In some embodiments, the coil 610 may be the same as or similar to the coil 200 and/or the coil 250. More descriptions for the coil 610 may be found elsewhere in the present disclosure.

In some embodiments, when the coil assembly 600 is used in an MRI device, the coil assembly 600 may be used as an RF receiving coil assembly that is configured to receive MR signals when the MRI device performs an image acquisition of a subject. The MRI device may include an RF transmitting coil assembly configured to emit and transmit RF pulse signals to the subject.

In some embodiments, if the coil assembly 600 is in a working mode, e.g., the coil assembly 600 receives signals (e.g., MR signals), the control circuit 520 may switch a state of the coil assembly 600 to the tuned state based on an input control signal (i.e., a resonance signal) to facilitate the coil 610 to receive the MR signal. The control circuit 620 (e.g., a preamplifier) may be used to process the MR signal and output an RF signal (i.e., the processed MR signal). The RF signal may be transmitted to a data processing unit (e.g., the data processing unit described in FIG. 1) for further processing to generate an image of the subject.

In some embodiments, if the coil assembly 600 is in an idle mode, e.g., the coil assembly 600 does not receive signals (e.g., MR signals), and the coil assembly 600 emits the RF pulse, the control circuit 620 may switch the state of the coil assembly 600 to the detuned state based on an input control signal (i.e., a detuning signal). In the detuned state, the coil 610 (i.e., the RF receiving coil) and the RF transmitting coil may be decoupled, thereby avoiding a mutual effect between different coils (i.e., the RF receiving coil and the RF transmitting coil).

The control circuit 620 may include a frequency modulation circuit 621, a detuning circuit 622, a matching circuit 623, and a preamplifier 624. The frequency modulation circuit 621 may be configured to adjust a resonance frequency of the coil assembly 600. The detuning circuit 622 may be configured to switch a state of the coil assembly 600 between a detuned state and a tuned state. The matching circuit 623 may be configured to adjust an impedance in a loop including the matching circuit 623, i.e., the input impedance of the preamplifier 624. The preamplifier 624 may be configured to output an RF signal when the coil assembly 600 is in the tuned state. In some embodiments, the matching circuit 623, the detuning circuit 622, the frequency modulation circuit 621, and the preamplifier 624 may be integrated on a circuit board, e.g., a PCB.

As shown in FIG. 6, a first end of the matching circuit 623 may electrically connect the first end of the coil 600. A first end of the detuning circuit 622 may electrically connect a second end of the matching circuit 623. A first end of the frequency modulation circuit 621 may electrically connect a second end of the detuning circuit 622, and a second end of the frequency modulation circuit 621 may electrically connect the second end of the coil 600. A first input end of the preamplifier 624 may electrically connect the first end of the matching circuit 623, and a second input end of the preamplifier 624 may electrically connect a second end of the matching circuit 623 and may have a grounded connection. A third end of the detuning circuit 622 may electrically connect the second input end of the preamplifier 624. A fourth end of the detuning circuit 622 may be configured to input an input control signal (e.g., a DC signal). An output end of the preamplifier 624 may be configured to output an RF when the coil 600 is in the tuned state.

The frequency modulation circuit 621 may include at least one tuning capacitor C9. The resonance frequency of a resonance circuit including the tuning capacitor C9 may be adjusted by adjusting the capacitance of the tuning capacitor C9. For example, the capacitance of the tuning capacitor C9 may be increased to decrease the resonance frequency to the desired resonance frequency; and the capacitance of the tuning capacitor C9 may be decreased to increase the resonance frequency to the desired resonance frequency. The MR signal with the desired resonance frequency may be detected by the coil assembly 600 when the resonance frequency is in the tuned state.

In one embodiment, the detuning circuit 622 may include a first capacitor 6221 (C7), a second capacitor 6222 (C8), an inductor 6223 (L6), and a diode 6224 (D3). A first end of the first capacitor 6221 may electrically connect the second input end of the preamplifier. A first end of the second capacitor 6222 may electrically connect a second end of the first capacitor 6221, and a second end of the second capacitor 6222 may electrically connect the first end of the frequency modulation circuit 621. A second end of the inductor 6223 may electrically connect the second end of the second capacitor 6222. A positive pole of the diode 6224 may electrically connect the second end of the inductor 6223, and a negative pole of the diode 6224 may electrically connect the second input end of the preamplifier 624. The first end of the inductor 6223 may be an input end of the input control signal.

The matching circuit 623 may include at least one matching capacitor C6. By adjusting the capacitance of the matching capacitor C6, the impedance of the resonant circuit including the matching capacitor C6 may be adjusted to an optimum impedance of the input end of the preamplifier 624. As used herein, the impedance of the input end of the preamplifier 624 may also be referred to as an input impedance of the preamplifier 624. The input impedance of the preamplifier 624 may be decreased by increasing the capacitance of the matching capacitor C6. In some embodiments, the input impedance of the preamplifier 624 may be adjusted to be matched with the output impedance of the preamplifier 624, such that noises in an outputted signal of the preamplifier 624 may be reduced. The input impedance of the preamplifier 624 matched with the output impedance of the preamplifier 624 may be referred to as the optimum impedance of the input end of the preamplifier 624. As used herein, the input impedance and the output impedance of the preamplifier 624 may be matched such that an output power of the preamplifier 624 is maximum. In some embodiments, a difference between the input impedance and the output impedance of the preamplifier 624 may be less than a threshold, such as 0, or 0.5 Ohm, or 0.3 Ohm, etc. In some embodiments, the input impedance of the preamplifier (e.g., the preamplifier 424, the preamplifier 524, the preamplifier 624) may be less than 0.5 Ohm, which improves a decoupling performance of the preamplifier and improve the SNR.

In some embodiments, when the input end of the control circuit 620 inputs a forward voltage (i.e., a resonance signal), the diode 6224 may conduct. When the diode 6224 is conducting, the first capacitor 6221, the second capacitor 6222, and the inductor 6223 may form a parallel circuit (also referred to as a detuning circuit) i.e., the resonance circuit of the coil assembly 600 may be the parallel circuit. The actual resonance frequency of the parallel circuit deviates from a desired resonance frequency that is determined or adjusted by the frequency modulation circuit 621. The actual resonance frequency of the parallel circuit may deviate from the frequency of the MR signal that is the same as the desired resonance frequency that is determined or adjusted by the frequency modulation circuit 621, such that the parallel circuit may be in a detuned state and fail to receive an MR signal, thereby decreasing a coupling interference among different coils (e.g., the RF transmitting coil and the RF receiving coil).

In some embodiments, the parallel circuit in the detuned state may form a high-impedance between the parallel circuit and the input ends of the preamplifier 624, thereby isolating the MR signal from the preamplifier 624 and protecting the preamplifier 624 from being damaged. Merely by way of example, when the input control signal is a 150 mA DC signal, the diode 6224 may conduct. At this time, the first capacitor 6221, the second capacitor 6222, and the inductor 6223 may form the parallel circuit in the detuned state, which results in high resistance.

In some embodiments, when the input end of the control circuit 620 inputs a reverse voltage (i.e., a detuning signal), the diode 5224 may not conduct. When the diode 2324 does not conduct, the coil 610, the matching circuit 623 (e.g., the matching capacitor C6), the first capacitor 6221, the second capacitor 6222, and the frequency modulation circuit 621 (e.g., the tuning capacitor C9) may form a resonance circuit The actual resonance frequency may be the same as the desired resonance frequency that is determined or adjusted by the frequency modulation circuit 621, and the resonance circuit may be in the tuned state. The coil assembly 600 (e.g., the coil 610) in the tuned state may receive the MR signal with the frequency that is the same as the actual resonance frequency or the desired resonance frequency and transmit the received MR signal to the preamplifier 624 for amplification. In some embodiments, the resonance frequency of the resonance circuit may be adjusted by adjusting the capacitance of the tuning capacitor C9, so that MR signals corresponding to different resonance frequencies may be received by the coil 610. The preamplifier 624 may amplify an MR signal and output a corresponding RF signal.

In some embodiments, the coil assembly 600 may further include an inductor 625. A first end of the inductor 625 may electrically connect the second end of the inductor 6223, and a second end of the inductor 625 may be an input end of the input control signal. The input control signal may pass through the inductor 625 and an alternating current (AC) signal included in the input control signal may be filtered by the inductor 625, and the input control signal without the AC signal may be configured to control a conduction of the diode 6224.

The control circuits and the coils illustrated in FIGS. 4-6 may be arranged independently. The coils may not include a surface mounted capacitor, a distributed capacitor, etc., which reduces a front-end circuit area of the coils, improves the flexibility of the coil, and reduces a volume and a weight of the coils. During a scan, the coils may be worn on the subject due to its flexibility and good bending property, thereby improving the SNR and the scan efficiency.

It should be noted that the above exemplary circuits of the coil assemblies illustrated in FIGS. 4 to 6 and the descriptions thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the coil assemblies may include one or more additional components and/or one or more components of the coil assemblies described above may be omitted.

Figure 7:
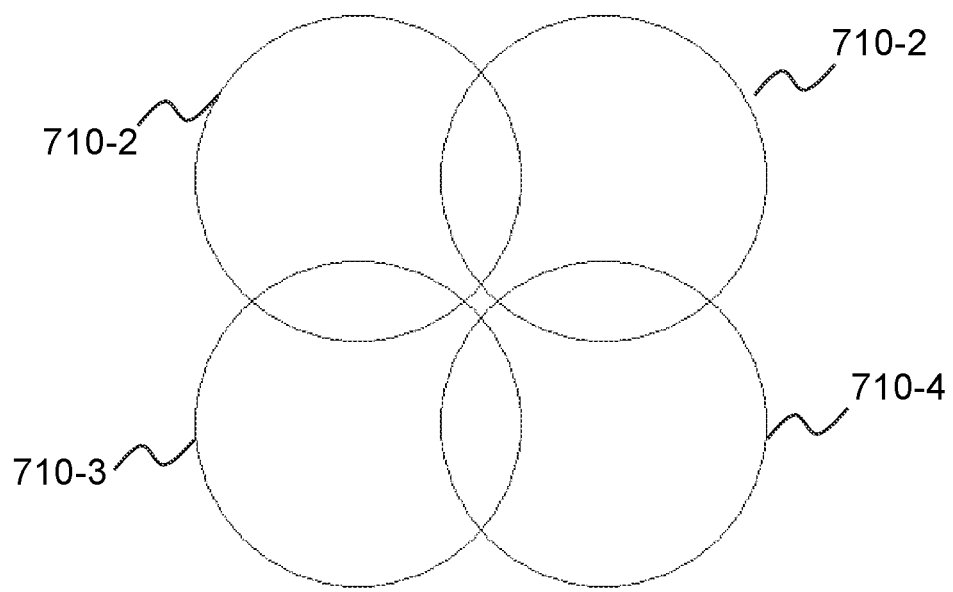
FIG. 7 is a schematic diagram illustrating an exemplary coil array of a coil assembly according to some embodiments of the present disclosure.

FIG. 7 is a schematic diagram illustrating an exemplary coil array 700 of a coil assembly according to some embodiments of the present disclosure. As shown in FIG. 7, the coil assembly may include multiple coil bodies 710 (i.e., coils) and multiple control circuits (not shown) each of which is electrically connected with one or more coils in the multiple coils. A connection between a coil and a control circuit may be found elsewhere in the present disclosure (e.g., FIGS. 4-6 and the descriptions thereof).

The multiple coils (e.g., a coil 710-1, a coil 710-2, a coil 710-3, a coil 710-4, etc.) may be arranged in an array including multiple rows and multiple columns. In some embodiments, there may be an overlap between two adjacent coils 710 (e.g., the coil 710-1 and the coil 710-2) in the same row to decouple the adjacent coils. In some embodiments, there may be an overlap between two adjacent coil bodies 10 (e.g., the coil 710-1 and the coil 710-3) in the same column to decouple the adjacent coil bodies 10. As used herein, an overlap between two coils refers to that a region defined by one of the two coils is overlapped between a region defined by another one of the two coils. In other words, an overlap between two coils may be formed by arranging one of the two coils on at least a portion of another one of the two coils. Two adjacent coil bodies 710 (e.g., the coil 710-1 and the coil 710-4) in different rows and columns in the array may be separated from each other. In other words, there is no overlap between two adjacent coils in different rows or columns. In some embodiments, a direction parallel to the row may be considered as a first direction, a direction parallel to the column may be considered as a second direction. In some embodiments, the first direction may be perpendicular to the second direction. In other words, an angle between the first direction and the second direction may be equal to 90 degrees. In some embodiments, the angle between the first direction and the second direction may be less than 90 degrees. In some embodiments, the angle between the first direction and the second direction may be equal to 80 degrees, 70 degrees, 50 degrees, etc.

Figure 8:
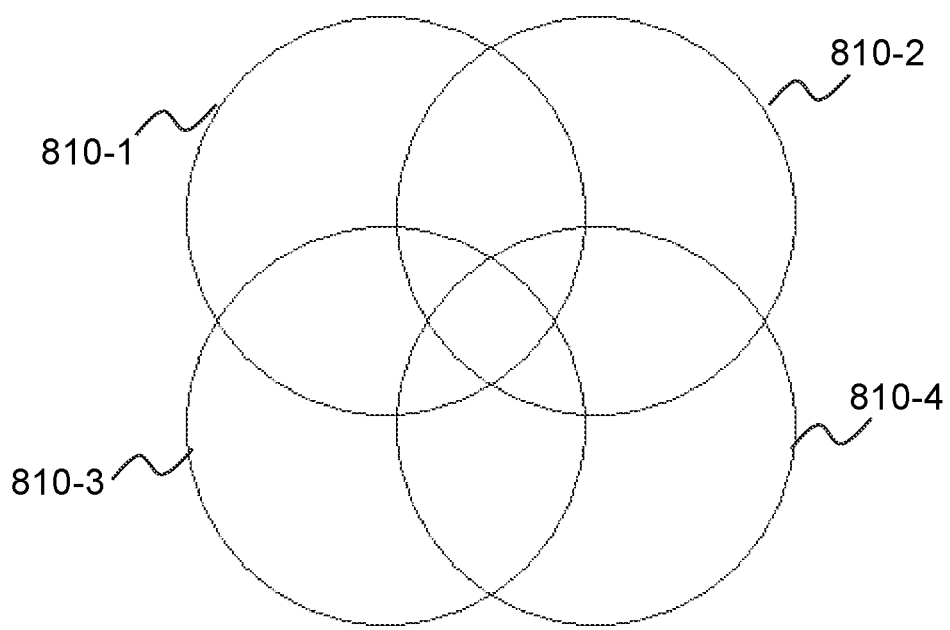
FIG. 8 is a schematic diagram illustrating an exemplary coil array of a coil assembly according to some embodiments of the present disclosure.

FIG. 8 is a schematic diagram illustrating an exemplary coil array 800 of a coil assembly according to some embodiments of the present disclosure. As shown in FIG. 8, the coil assembly may include multiple coil bodies 810 (i.e., coils) and multiple control circuits (not shown) each of which is electrically connected with one or more coils in the multiple coils. A connection between a coil and a control circuit may be found elsewhere in the present disclosure (e.g., FIGS. 4-6 and the descriptions thereof).

The multiple coils (e.g., a coil 810-1, a coil 810-2, a coil 810-3, a coil 810-4, etc.) may be arranged in an array including multiple rows and multiple columns. In some embodiments, there may be an overlap between two adjacent coils 810 (e.g., the coil 810-1 and the coil 810-2) in the same row to decouple the adjacent coils. In some embodiments, there may be an overlap between two adjacent coils 810 (e.g., the coil 810-1 and the coil 810-3) in the same column to decouple the adjacent coils. Two adjacent coil bodies 810 (e.g., the coil 810-1 and the coil 810-4) in different rows or columns in the array may be overlapped. In other words, there is an overlap between two adjacent coils in different rows and columns. For example, there may be an overlap between two adjacent coils 810 (e.g., the coil 810-1 and the coil 810-4) in the same diagonal line to decouple the adjacent coils.

At this time, each two adjacent coils in the coil assembly 800 are overlapped, which may improve a decoupling performance and realize effective signals acquisition, thereby improving the image performance acquired under an accelerator sequence of an MR device. The coils in the coil assembly 800 may be overlapped at different degrees. In other words, an overlapped region between a region defined by a coil of two adjacent coils and a region defined by another coil of the two adjacent coils may be in different sizes. In addition, the coil assembly 800 may have a good decoupling effect, and the overlap between adjacent coils may not affect the SNR of the MR signals. When MR signals are acquired under an accelerator pulse sequence, the MR signals may not be lost and the SNR may be not decreased. The coil assembly 800 may be arranged into any suitable shape. Therefore, the coil assembly 800 may improve the flexibility of a distribution of the coils and reduce the complexity of the coil (e.g., a flexible RF coil).

Figure 9:
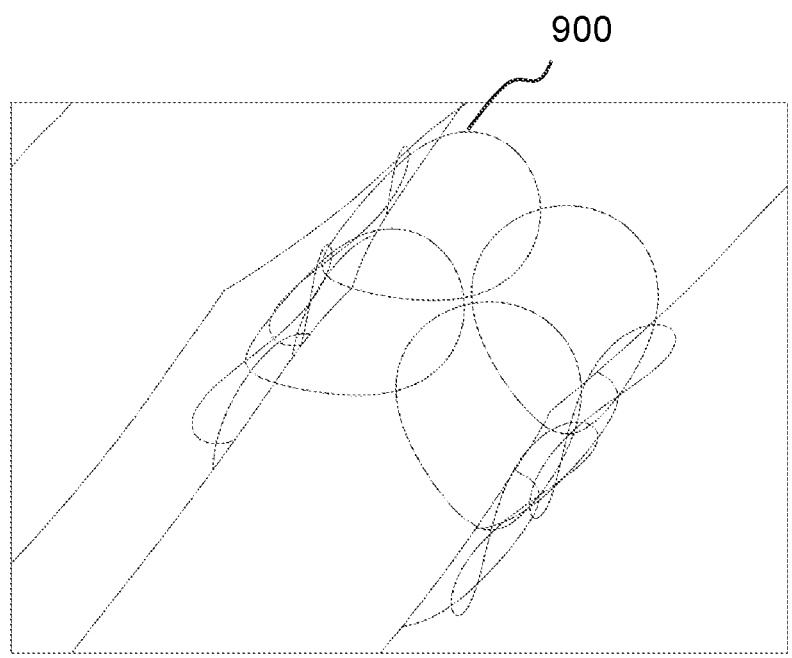
FIG. 9 is a schematic diagram illustrating an exemplary coil assembly for wrapping an arm joint according to some embodiments of the present disclosure.
Figure 10:
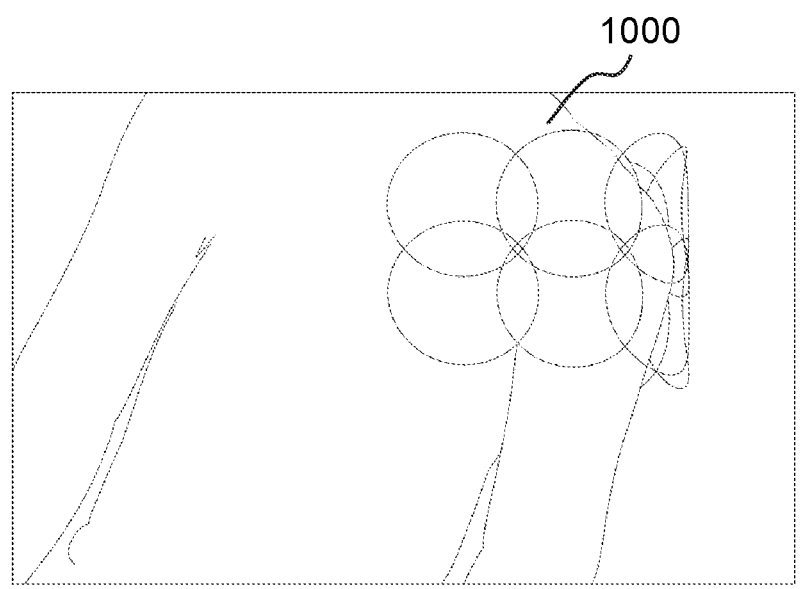
FIG. 10 is a schematic diagram illustrating an exemplary coil assembly for wrapping a shoulder according to some embodiments of the present disclosure.
Figure 11:
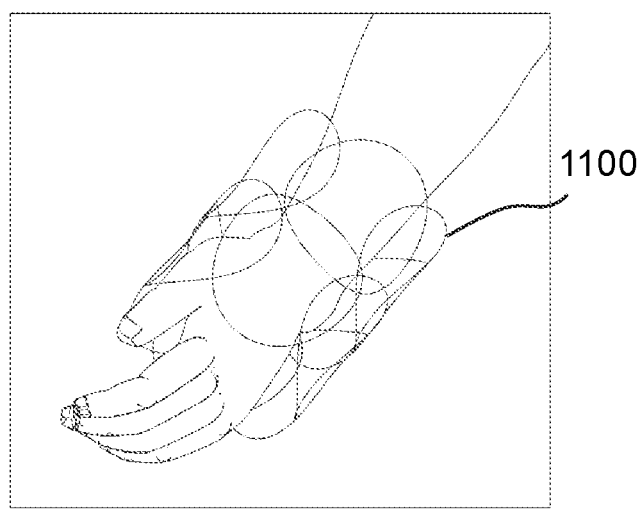
FIG. 11 is a schematic diagram illustrating an exemplary coil assembly for wrapping a wrist according to some embodiments of the present disclosure.

In this way, the coil assembly 800 may solve coupling between different coils (which forms channels for data acquisition) under different diameters, and improve the applicability to subjects with different sizes. In addition, the coil assembly 800 may improve the acceleration performance of the flexible coils and an image SNR. The coil assembly 800 may be used to wrap any shapes of subject, e.g., a joint (or any other body part of a human body). Thus, the coil assembly 800 may improve the use flexibility and the comfort, simplify the working steps for imaging the subject, and improve the scan efficiency. For example, FIGS. 9-11 are schematic diagrams illustrating coil assemblies for wrapping different parts of a human body according to some embodiments of the present disclosure. FIG. 9 is a schematic diagram illustrating an exemplary coil assembly for wrapping an arm joint according to some embodiments of the present disclosure. FIG. 10 is a schematic diagram illustrating an exemplary coil assembly for wrapping a shoulder according to some embodiments of the present disclosure. FIG. 11 is a schematic diagram illustrating an exemplary coil assembly for wrapping a wrist according to some embodiments of the present disclosure. As shown in FIGS. 9-11, the coil assemblies 900, 1000, and 1100 may be flexible to conform shapes of parts of the human body where the coil assemblies 900, 1000, and 1100 are arranged, respectively. In some embodiments, each of the coil assemblies 900, 1000, and 1100 may include multiple coils arranged as an array as described in the coil assembly 800 or the coil assembly 700. In some embodiments, the count (or number) of coils in each of the coil assemblies 900, 1000, and 1100 may be the same or different. The count (or number) of coils in one of the coil assemblies 900, 1000, and 1100 may be adjusted according to the size of a part of the human body that the one of the coil assemblies 900, 1000, and 1100 is used to wrap.

Figure 12:
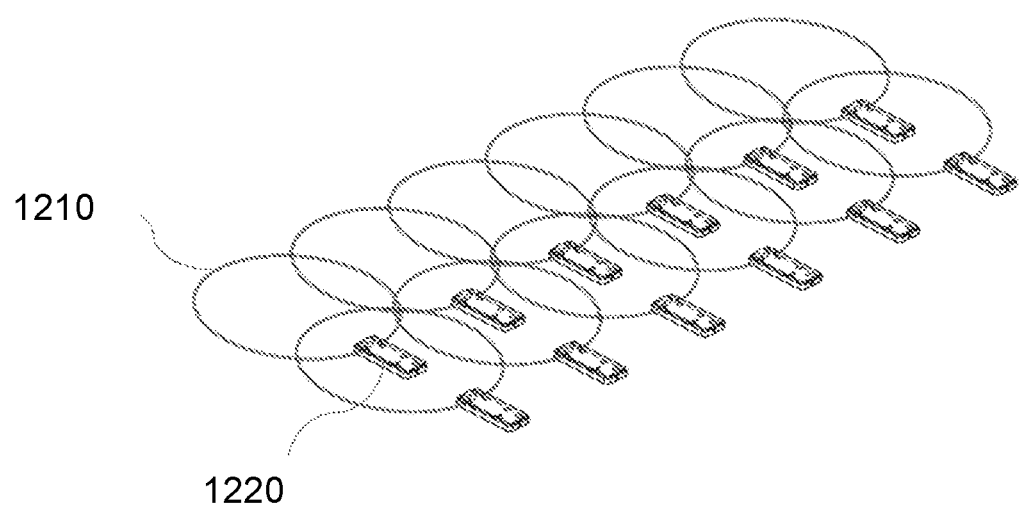
FIG. 12 is a schematic diagram illustrating an exemplary coil assembly according to some embodiments of the present disclosure.

FIG. 12 is a schematic diagram illustrating an exemplary coil assembly according to some embodiments of the present disclosure. As shown in FIG. 12, the coil assembly 1200 may include two rows of coil bodies 1210 and two rows of control circuits 1220. The two rows of coil bodies 1210 may be arranged in an array including multiple rows and multiple columns. In some embodiments, there may be an overlap between every two adjacent coils in the same row, in the same column, and in different rows and different columns. Each of the control circuits 1220 may electrically connect a first end and a second end of one of the coils 1210. In some embodiments, a control circuit electrically connecting a specific coil 1210 may be arranged inside a region defined by one of the coils 1210 that is adjacent to the specific coil. For example, a control circuit 1220 connected to a coil in a first row may be located inside a region defined by a coil located inside a region defined by an adjacent coil in a second row. As another example, a control circuit connected to a coil in the second row may be located inside a region defined by an adjacent coil in the first row. The multiple control circuits may be distributed at different locations, which may reduce a protrusion caused by the control circuits when the control circuits are located at the same position.

In some embodiments, the coil assembly 1200 may be mounted on a base plate. The base plate may include a plurality of holes, a first surface, and a second surface opposite to the first surface. Each coil in the coil assembly 1200 may pass through at least a portion of the plurality of holes to be mounted on the base plate. In some embodiments, each control circuit in the coil assembly 1200 may be physically connected with the base plate via, for example, welding, bolts, riveting, etc. More descriptions for the base plate may be found in FIGS. 13-14.

Figure 13:
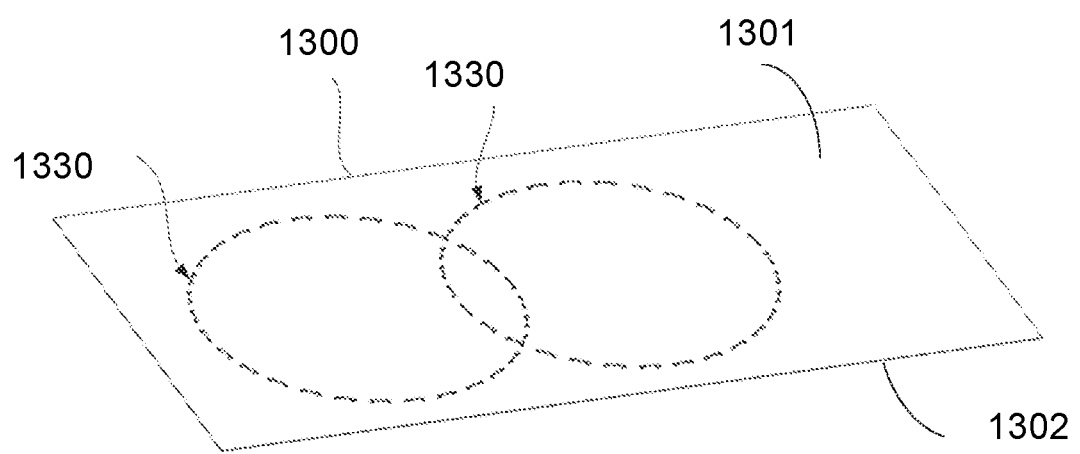
FIG. 13 is a schematic diagram illustrating an exemplary baseplate according to some embodiments of the present disclosure.
Figure 14:
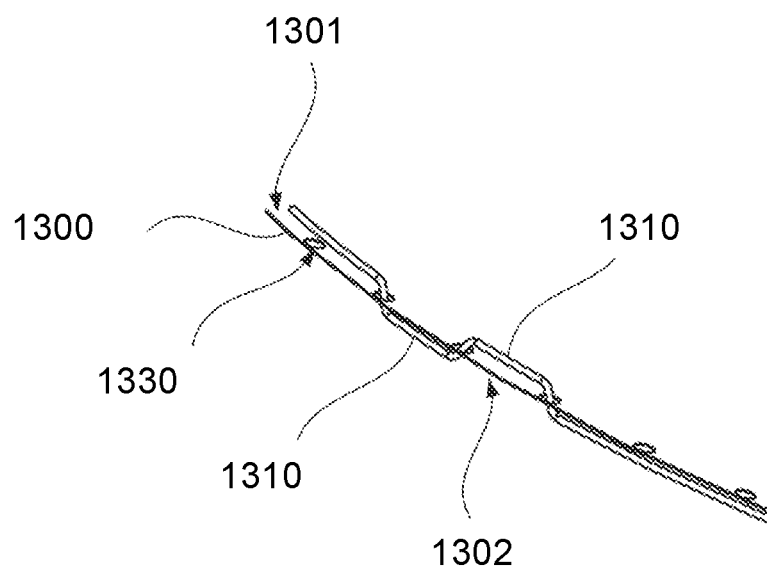
FIG. 14 is a schematic diagram illustrating a portion of the baseplate including a portion of a coil according to some embodiments of the present disclosure.

FIG. 13 is a schematic diagram illustrating an exemplary baseplate 1300 according to some embodiments of the present disclosure. FIG. 14 is a schematic diagram illustrating a portion of the baseplate 1300 including a portion of a coil according to some embodiments of the present disclosure. As shown in FIGS. 13 and 14, the baseplate 1300 may include a plurality of holes 1330, a first surface 1301, and a second surface 1302 opposite to the first surface 1301. The holes 1330 may be in any suitable shape. The diameter of each of the holes 1330 may exceed the diameter of a coil as described elsewhere in the present disclosure, such that the coil may pass through at least a portion of the holes 1330.

In some embodiments, one or more coils in a coil assembly as described elsewhere in the present disclosure may be arranged on the baseplate 1300. Each of the one or more coils may pass through at least a portion of the plurality of holes 1330. As shown in FIG. 14, a portion of a coil 1310 may be located at the first surface 1301 of the baseplate 1300 and a portion of the coil 1310 may be arranged at the second surface 1302 of the baseplate 1300. In this way, the coil 1310 may be fixed on the baseplate 1300 without using other auxiliary structures, a desired design form of the coil may be fully presented, the manufacturing process is simple, and the reproducibility is strong. In addition, since the bending property and reliability of the coil is better than those of flexible circuit boards used in existing flexible coils, the baseplate may include a and flexible softer material, so that the coil assembly arranged on the baseplate 1300 may be fitter to a subject when worn on the subject.

In some embodiments, the baseplate 1300 may include a flexible material, such as leather, cloth, plastic, or the like, or any combination thereof. The leather, such as PU, may make the baseplate 1300 soft and conform to different shapes of the subject to be scanned. The cloth may include a cotton wool, a chemical fiber, a woolen cloth, a fiber cloth, or the like, or any combination thereof. The plastic may include a soft rubber. It should be noted that the baseplate 1300 may not have a tensile property. Therefore, when the coils pass through the hole 1330 and fix on the baseplate 1300, the coils may be prevented from being easily pulled to change the performance of the coil assemblies.

Figure 15:
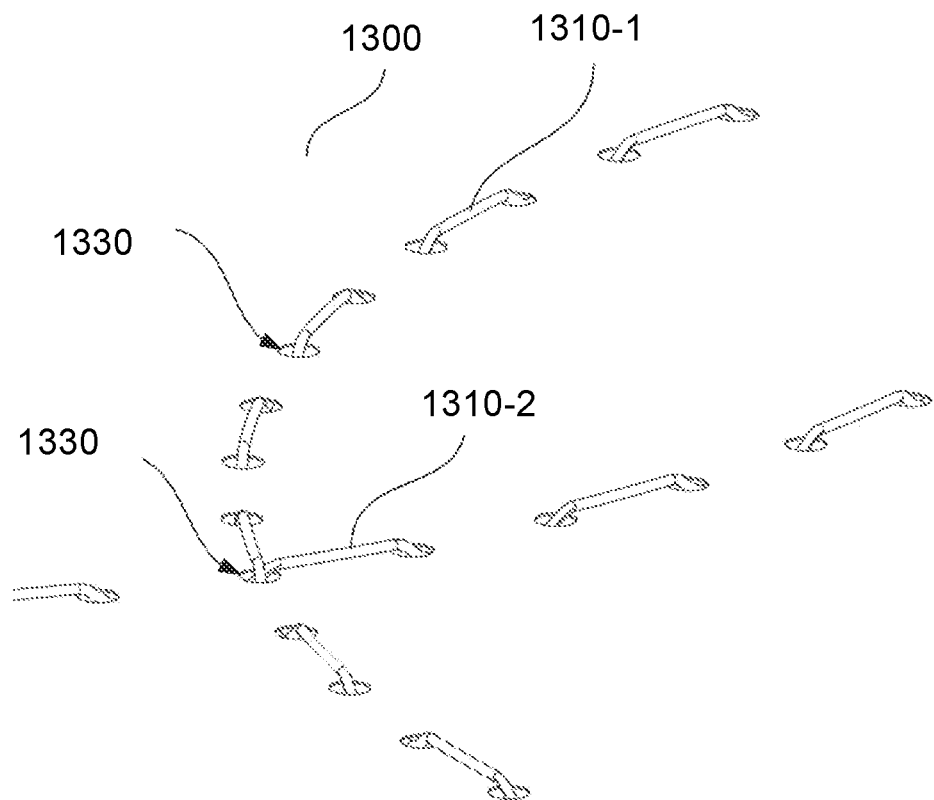
FIG. 15 is a schematic diagram illustrating the baseplate including at least two overlapped coils according to some embodiments of the present disclosure.

In some embodiments, two adjacent coils may be overlapped on the base plate 1300. The two adjacent coils may pass through the same hole 1330 of the baseplate 1300. For example, FIG. 15 is a schematic diagram illustrating the baseplate 1300 including at least two overlapped coils according to some embodiments of the present disclosure. As shown in FIG. 15, the at least two coils (e.g., a coil 1310-1 and a coil 1310-2) may pass through the same hole 1330. That is, the at least two coil bodies may have an overlap region. The coil 1310-1 and the coil 1310-2 may intersect at the same hole 1330. As each of the coil 1310-1 and the coil 1310-2 include a protective layer that is insulated, the coil 1310-1 and the coil 1310-2 intersecting at the same hole 1330 may be physically separated. In this way, the at least two coils 1310 may be decoupled, a mutual inductance of the at least two coils 1310 may be reduced, the process for preparing the coil assembly including the at least two coil bodies may be simplified.

In some embodiments, the coil assembly mounted on the base plate 1300 may be located in a housing. The housing may enclose the base plate 1300. The housing may be provided with a port that is electrically connected with control circuits of the coil assembly. For example, the port may be configured with multiple connectors each of which is configured to connect one of the control circuits of the coil assembly. The coil assembly may be driven to operate by electrically connected with an external circuit via the port.

Figure 16:
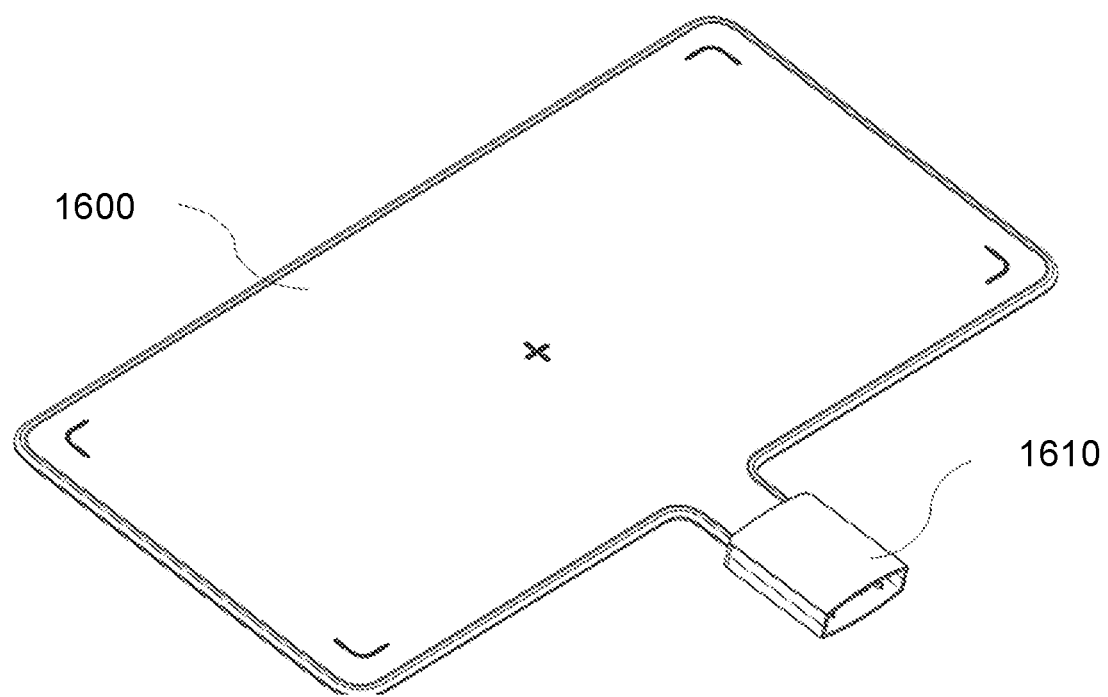
FIG. 16 is a schematic diagram illustrating an exemplary housing for accommodating a coil assembly according to some embodiments of the present disclosure.

As shown in FIG. 16, FIG. 16 is a schematic diagram illustrating an exemplary housing 1600 for accommodating a coil assembly according to some embodiments of the present disclosure. The housing 1600 may be configured to accommodate a coil assembly as described elsewhere in the present disclosure. For example, the housing 1600 may wrap the aforementioned baseplate where the coil assembly is mounted on. The housing 1600 may include an insulating material, e.g., fabric, fur. As shown in FIG. 16, the housing 1600 may include a coupling port 1610 that is provided at one end of the housing 1600. The coupling port 1610 may be connected to control circuits (e.g., the control circuit 320) of the coil assembly. In some embodiment, the coupling port 1610 may include a plurality of connectors (e.g., plug pins), and each connector (e.g., a plug pin) may be respectively connected to one of the control circuits in the coil assembly. In some embodiments, the housing 1600 may include a flexible material, such as leather, cloth, plastic, or the like, or any combination thereof.

It should be noted that the FIGS. 7 to 16 and the descriptions thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

It will be apparent to those skilled in the art that various changes and modifications can be made in the present disclosure without departing from the spirit and scope of the disclosure. In this manner, the present disclosure may be intended to include such modifications and variations if the modifications and variations of the present disclosure are within the scope of the appended claims and the equivalents thereof.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate a certain variation (e.g., ±1%, ±5%, ±10%, or ±20%) of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable. In some embodiments, a classification condition used in classification is provided for illustration purposes and modified according to different situations. For example, a classification condition that "a probability value is greater than the threshold value" may further include or exclude a condition that "the probability value is equal to the threshold value".

What is claimed is:

1. A magnetic resonance imaging (MRI) radio frequency (RF) coil assembly, comprising:
   one or more coils each of which includes a first end and a second end; and
   one or more control circuits each of which electrically connects the first end and the second end of one of the one or more coils, wherein each of the one or more control circuits is configured to adjust, based on an input control signal, an operation of the coil that is electrically connected with the control circuit, and the one or more control circuits are located at different regions, wherein one of the one or more control circuits includes:
   a matching circuit a first end of which electrically connects the first end of the coil, the matching circuit being configured to adjust an impedance in a loop including the matching circuit;
   a detuning circuit a first end of which electrically connects a second end of the matching circuit;
   a tuning capacitor a first end of which electrically connects a second end of the detuning circuit, a second end of the tuning capacitor electrically connecting the second end of the coil;

a preamplifier a first input end of which electrically connects the first end of the matching circuit, a second input end of the preamplifier electrically connecting a second end of the matching circuit and having a grounded connection;

a third end of the detuning circuit electrically connects the second input end of the preamplifier;

a fourth end of the detuning circuit is configured to input the input control signal; and an output end of the preamplifier is configured to output a radio frequency signal when the coil is in a tuned state.

2. The MRI RF coil assembly of claim 1, wherein the operation of the coil includes a detuned state or a tuned state, and the control circuit is configured to adjust, based on the input control signal, a switch between the detuned state and the tuned state.

3. The MRI RF coil assembly of claim 1, wherein one of the one or more control circuits includes:

a first capacitor a first end of which electrically connects the second input end of the preamplifier;

a second capacitor a first end of which electrically connects a second end of the first capacitor, a second end of the second capacitor electrically connecting the first end of the tuning capacitor;

an inductor, a second end of the inductor electrically connecting the second end of the second capacitor;

a diode a positive pole of which electrically connects the second end of the inductor, a negative pole of the diode electrically connecting the second input end of the preamplifier, the first end of the inductor being an input end of the input control signal.

4. The MRI RF coil assembly of claim 1, wherein an input impedance of the preamplifier is less than 0.5 Ohm.

5. The MRI RF coil assembly of claim 1, wherein the coil includes a support and an electric conductor that enfolds the support portion, the support portion including an insulating material, the support and the electric conductor being coaxial.

6. The MRI RF coil assembly of claim 5, wherein the electric conductor includes a metal fabric layer including a plurality metal wires that are crossed and connected with each other.

7. The MRI RF coil assembly of claim 1, wherein one or more coils in the one or more coil assemblies are arranged overlapped on a baseplate, the baseplate including a plurality of holes, each of the one or more coils passing through at least a portion of the plurality of holes, and a portion of the coil being arranged at a first surface of the baseplate and a portion of the coil being arranged at a second surface of the baseplate.

8. The MRI RF coil assembly of claim 1, wherein the tuning capacitor, the detuning circuit, and the preamplifier are integrated on a print current board (PCB).

9. The MRI RF coil assembly of claim 1, wherein each of the one or more control circuits electrically connected with a coil is located in a region defined by another coil adjacent to the coil.

10. A device for magnetic resonance imaging (MRI), comprising:

a coil assembly configured to receive an MR signal generated from a subject, including:

one or more coils each of which includes a first end and a second end, at least two adjacent coils defining an overlapping region; and one or more control circuits each of which electrically connects the first end and the second end of each of at least a portion of the one or more coils, wherein each of the one or more control circuits is configured to adjust, based on an input control signal, an operation of at least a portion of the one or more coils that electrically connects the control circuit, and each of the one or more control circuits includes a plurality of electronic components, at least one electronic component electrically connected with one of the at least two adjacent coils is positioned outside the overlapping region, wherein one of the one or more control circuits includes:

a matching circuit a first end of which electrically connects the first end of the coil, the matching circuit being configured to adjust an impedance in a loop including the matching circuit;

a detuning circuit a first end of which electrically connects a second end of the matching circuit;

a tuning capacitor a first end of which electrically connects a second end of the detuning circuit, a second end of the tuning capacitor electrically connecting the second end of the coil;

a preamplifier a first input end of which electrically connects the first end of the matching circuit, a second input end of the preamplifier electrically connecting a second end of the matching circuit and having a grounded connection;

a third end of the detuning circuit electrically connects the second input end of the preamplifier;

a fourth end of the detuning circuit is configured to input the input control signal; and an output end of the preamplifier is configured to output a radio frequency signal when the coil is in a tuned state.

11. The device of claim 10, wherein the tuning capacitor, the detuning circuit, and the preamplifier are integrated on a print current board (PCB).

12. The device of claim 10, wherein:

the tuning capacitor configured to adjust a resonance frequency of the coil assembly;

the detuning circuit is configured to switch a state of the coil assembly between a detuned state and a tuned state.

13. The system of claim 10, wherein an input impedance of the preamplifier is less than 0.5 Ohm.

14. A device for magnetic resonance imaging (MRI), comprising:

a coil assembly configured to receive an MR signal generated from a subject, including:

one or more coils each of which includes a first end and a second end; and one or more control circuits each of which electrically connects the first end and the second end of each of at least a portion of the one or more coils, wherein each of the one or more control circuits is configured to adjust, based on an input control signal, an operation of at least a portion of the one or more coils that electrically connects the control circuit, and at least one of the one or more coils includes an electric conductor, the electric conductor including a metal fabric layer that includes a plurality of metal wires crossed and connected with each other, wherein one of the one or more control circuits includes:

a matching circuit a first end of which electrically connects the first end of the coil, the matching circuit being configured to adjust an impedance in a loop including the matching circuit;

a detuning circuit a first end of which electrically connects a second end of the matching circuit;

a tuning capacitor a first end of which electrically connects a second end of the detuning circuit, a second end of the tuning capacitor electrically connecting the second end of the coil;

a preamplifier a first input end of which electrically connects the first end of the matching circuit, a second input end of the preamplifier electrically connecting a second end of the matching circuit and having a grounded connection;

a third end of the detuning circuit electrically connects the second input end of the preamplifier;

a fourth end of the detuning circuit is configured to input the input control signal; and an output end of the preamplifier is configured to output a radio frequency signal when the coil is in a tuned state.

\* \* \* \* \*